(12) United States Patent
Fujita et al.

(10) Patent No.: US 7,965,556 B2
(45) Date of Patent: *Jun. 21, 2011

(54) NONVOLATILE SEMICONDUCTOR MEMORY

(75) Inventors: Norihiro Fujita, Yokohama (JP); Hiroyuki Nagashima, Yokohama (JP); Hiroshi Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/788,614

(22) Filed: May 27, 2010

(65) Prior Publication Data

US 2010/0238727 A1   Sep. 23, 2010

Related U.S. Application Data

(63) Continuation of application No. 12/339,879, filed on Dec. 19, 2008, now Pat. No. 7,755,947, which is a continuation of application No. 11/609,646, filed on Dec. 12, 2006, now Pat. No. 7,486,569.

(30) Foreign Application Priority Data

Dec. 14, 2005 (JP) ................................. 2005-359711

(51) Int. Cl.
 *G11C 16/04* (2006.01)
(52) U.S. Cl. .......... 365/185.17; 365/185.05; 365/185.04
(58) Field of Classification Search ............. 365/185.17, 365/189.04, 189.14, 230.03, 189.08, 185.05
See application file for complete search history.

(56) References Cited

U.S. PATENT DOCUMENTS

| 6,324,114 | B1 | 11/2001 | Himeno |
| 6,768,660 | B2 | 7/2004 | Kong et al. |
| 7,287,115 | B2 | 10/2007 | Otani et al. |
| 7,363,558 | B2 | 4/2008 | Fukuyama |
| 7,486,569 | B2 * | 2/2009 | Fujita et al. ............. 365/189.04 |
| 7,502,256 | B2 | 3/2009 | Merry, Jr. et al. |
| 7,755,947 | B2 * | 7/2010 | Fujita et al. ............. 365/185.17 |
| 2005/0034021 | A1 * | 2/2005 | Fukuyama ........................ 714/30 |
| 2005/0114613 | A1 * | 5/2005 | Otani et al. ..................... 711/154 |
| 2006/0117393 | A1 * | 6/2006 | Merry et al. ...................... 726/34 |

FOREIGN PATENT DOCUMENTS

| JP | 11-120075 | 4/1999 |
| JP | 2002-314033 | 10/2002 |
| JP | 2003-7963 | 1/2003 |

* cited by examiner

*Primary Examiner* — Hoai V Ho
*Assistant Examiner* — Fernando N Hidalgo
(74) *Attorney, Agent, or Firm* — Oblon, Spivak, McClelland, Maier & Neustadt, L.L.P.

(57) ABSTRACT

A nonvolatile semiconductor memory includes: a first semiconductor chip on which a first memory in mounted; a second semiconductor chip on which a second memory is mounted; wherein in the second memory which is a destination for copying, a read enable operation is performed after booting up a command which makes the read enable operation recognize as a write enable operation, and a data of the first memory, which is a source of the copy, is copied to the second memory.

10 Claims, 16 Drawing Sheets

Fig. 2

| Left pins | | Right pins | |
|---|---|---|---|
| NC | 1 | 48 | NC |
| NC | 2 | 47 | NC |
| NC | 3 | 46 | NC |
| NC | 4 | 45 | NC |
| NC | 5 | 44 | I/O8 |
| $\overline{RY/BY1}$ | 6 | 43 | I/O7 |
| $\overline{RY/BY0}$ | 7 | 42 | I/O6 |
| $\overline{RE}$ | 8 | 41 | I/O5 |
| $\overline{CE0}$ | 9 | 40 | NC |
| $\overline{CE1}$ | 10 | 39 | PSL |
| NC | 11 | 38 | NC |
| Vcc | 12 | 37 | Vcc |
| Vss | 13 | 36 | Vss |
| NC | 14 | 35 | NC |
| NC | 15 | 34 | NC |
| CLE | 16 | 33 | NC |
| ALE | 17 | 32 | I/O4 |
| $\overline{WE}$ | 18 | 31 | I/O3 |
| $\overline{WP}$ | 19 | 30 | I/O2 |
| NC | 20 | 29 | I/O1 |
| NC | 21 | 28 | NC |
| NC | 22 | 27 | NC |
| NC | 23 | 26 | NC |
| NC | 24 | 25 | NC |

Fig. 3

| ABBREVIATED EXPRESSIONS | FORMAL NOMENCLATURE |
|---|---|
| I/O1~I/O8 | INPUT / OUTPUT |
| $\overline{CE0}$ | CHIP ENABLE (CHIP "0") |
| $\overline{CE1}$ | CHIP ENABLE (CHIP "1") |
| $\overline{WE}$ | WRITE ENABLE |
| $\overline{RE}$ | READ ENABLE |
| CLE | COMMAND LATCH ENABLE |
| ALE | ADDRESS LATCH ENABLE |
| PSL | POWER ON SELECT |
| $\overline{WP}$ | WRITE PROTECT |
| RY/$\overline{BY0}$ | READY / BUSY (CHIP "0") |
| RY/$\overline{BY1}$ | READY / BUSY (CHIP "1") |
| Vcc | POWER SUPPLY |
| Vss | GLAND |
| NC | NO CONNECTING |

NONVOLATILE SEMICONDUCTOR MEMORY

CROSS REFERENCE TO RELATED APPLICATION

The present continuation application claims the benefit of priority under 35 U.S.C. 120 to application Ser. No. 12/339,879, filed on Dec. 19, 2008, which is a continuation of application Ser. No. 11/609,646, filed Dec. 12, 2006, and claims the benefit of priority under 35 U.S.C. 119 from Japanese Application No. 2005-359711, filed on Dec. 14, 2005, the entire contents of each of which are hereby incorporated herein by reference.

BACKGROUND OF THE INVENTION

1. Field of the Invention

The present invention relates to a nonvolatile semiconductor memory, and in particular, relates to a nonvolatile semiconductor memory having a multi-chip module structure.

2. Description of the Related Art

As one of semiconductor memories, an electrically erasable EEPROM (electrically erasable programmable read only memory) is known. Among these, a NAND cell type EEPROM (hereinafter it will be simply called "a NAND type flash memory"), in which a block (a NAND cell block) is configured connecting a plurality of memory cells in series, has been paid attention as a nonvolatile semiconductor memory, in which high integration and capacity enlargement may be realized.

The NAND type flash memory is configured to a semiconductor chip in which the function circuit is mounted on the surface. A multi-chip module, in which a plurality of NAND type flash memories are mounted on a plurality of the semiconductor chips respectively to realize further high integration and capacity enlargement and these plurality of semiconductor chips are stacked, are proposed in Japanese Patent Laid-Open Publication No. 2002-314,033. The multi-chip module may construct the NAND type flash memory having one large-scale capacity by providing a plurality of NAND type flash memories.

In such a multi-chip module, when copying of data among the plurality of NAND type flash memories (semiconductor chips) is performed, speedup of the data copy could not be performed.

BRIEF SUMMARY OF THE INVENTION

In accordance with a first aspect of the embodiment of the present invention is that a nonvolatile semiconductor memory includes: a first semiconductor chip, on which a first memory is mounted; a second semiconductor chip, on which a second memory is mounted; wherein in the second memory which is a destination for copying, a read enable operation is performed after booting up a command which makes the read enable operation recognize as a write enable operation, and a data of the first memory, which is a source of the copy, is copied to the second memory.

According to a second aspect of the embodiment of the present invention is that the nonvolatile semiconductor memory includes: a first semiconductor chip, on which a first memory is mounted; a second semiconductor chip, on which a second memory is mounted; wherein a command is booted up, where a read enable operation of the first memory and a write enable operation of the second memory are performed at a time, after the write enable operation is not made recognize in the first memory which is a destination for copying and the read enable operation is not made recognized in the second memory which is a destination to be copied, According to a third aspect of embodiment of the present invention is that a nonvolatile semiconductor memory includes: a first semiconductor chip, on which a first memory is mounted; a second semiconductor chip, on which a second memory is mounted; wherein in the first memory which is a source of copying, a write enable operation is performed after booting up a command where the write enable operation and a read enable operation are made recognize, and a data of the first memory which is a source of copying is copied to the second memory.

According to a fourth aspect of embodiment of the present invention is that the nonvolatile semiconductor memory includes:

a first semiconductor chip, on which a first memory is mounted;

a second semiconductor chip, on which a second memory is mounted;

wherein in the second memory which is a destination to be copied, a read enable operation is performed after booting up a command, where the read enable operation is made recognize to a data input to the second memory.

BRIEF DESCRIPTION OF THE DRAWINGS

FIG. 2 is a layout diagram showing an example of a pin arrangement of the nonvolatile semiconductor memory according to the first embodiment.

FIG. 3 is a diagram showing correspondence of abbreviated designations of the pins to their full names.

DETAILED DESCRIPTION OF THE PREFERRED EMBODIMENTS

Process to Reach the Present Invention

For instance, in the nonvolatile semiconductor memory, in which two semiconductor chips where NAND type flash memories are respectively mounted are stacked, when case data is output from one NAND type flash memory, the other NAND type flash memory is in a non-selection state. Thus, when data copying is performed among the NAND type flash memories (chips), the following procedure is required to be stepped on. First of all, data is output from one NAND type flash memory and the output data is tentatively stored to a buffer memory prepared in an outside section. Then, the data stored tentatively in the buffer memory is output, and thus the data is programmed into the other NAND type flash memory. Therefore, the data capacity being able to copy at a time is limited depending upon data capacity of the buffer memory. In addition, it is difficult to perform a high-speed data copy because the data copy is performed via the buffer memory prepared in the outside section.

In addition, there are mainly two types in selection methods of the NAND type flash memory of the nonvolatile semiconductor memory. One of them is a method for depositing the /CE (chip enable) pin and the RY or /BY (ready or busy) pin every NAND type flash memory to recognize the plurality of NAND type flash memories (semiconductor chips) from the outside and using the outside pin for selection of the NAND type flash memory. That is, selection and non-selection of the NAND type flash memory may be switched by a chip enable signal which is input to the /CE pin, and a status where the NAND type flash memory in which a signal level of RY or /BY pin is detected and selected, is in a ready state or a busy state. The pins except for the /CE pin or RY or /BY pin are deposited to all of the plurality of NAND type flash memories as common pins. The other selection method is a method for depositing all the pins including the /CE pin and RY or /BY pin to the plurality of NAND type flash memories as common pins and switching whether the NAND type flash memory is the selection or the non-selection using a part of address signals, for instance, the upper address signal. In either of the selection methods, the plurality of NAND type flash memories are set in the selection state at a time, and the output operation and the input operation of the data of the NAND type flash memory of the selection state may be performed at a time. However, different operation which is selected at a time may not be performed. That is to say, in these nonvolatile semiconductor memory divide, when data copying is performed among the NAND flash memories, all of the data output of the NAND type flash memories which is in a selection state may be performed at a time. The output operation of data is performed in one NAND type flash memory and, in the meantime, however, the input operation may not be performed in the other NAND type flash memory. Therefore, it takes time for copying data.

Figure 15:
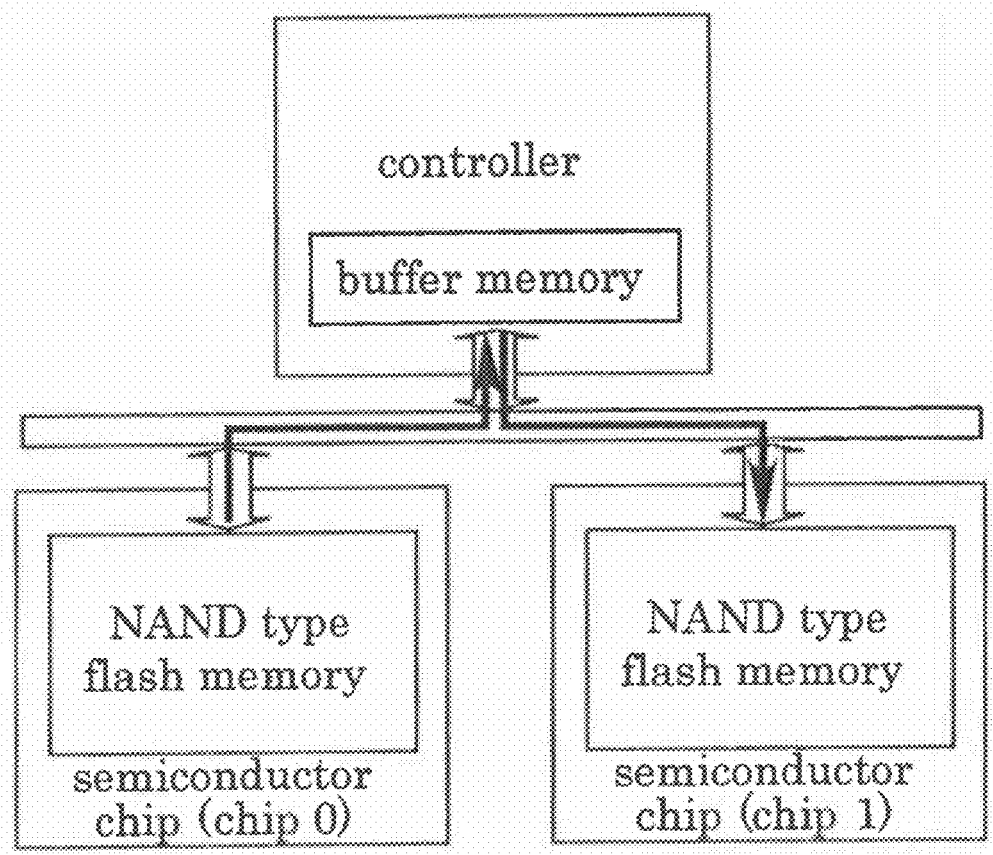
FIG. 15 is a block diagram explaining the operation of data copying among the NAND type flash memory in the nonvolatile semiconductor memory according to the related art of the first embodiment.

In FIG. 15, an example of operation image according to the data copying among the NAND type flash memories (between semiconductor chips) in the nonvolatile semiconductor memory is shown. In the same diagram, the arrows show a series of data flow. In the nonvolatile semiconductor memory, the output operation of data from the NAND type flash memory mounted on a chip "0" and the input operation of data to the NAND type flash memory mounted on chip "1" may not be performed at a time. Thus, in a general nonvolatile semiconductor memory, at first, the data is output to the NAND type flash memory which is mounted on the chip "1" from the buffer memory, after the data is output to the buffer memory which is prepared in a outside section fro the NAND type flash memory which is mounted on the chip "0". Thus, in the nonvolatile semiconductor memory, at the time of data copying operation among the NAND type flash memories, it is necessary to store the data tentatively to the buffer memory by all means, and thus it takes time to process the data copying operation.

Figure 16:
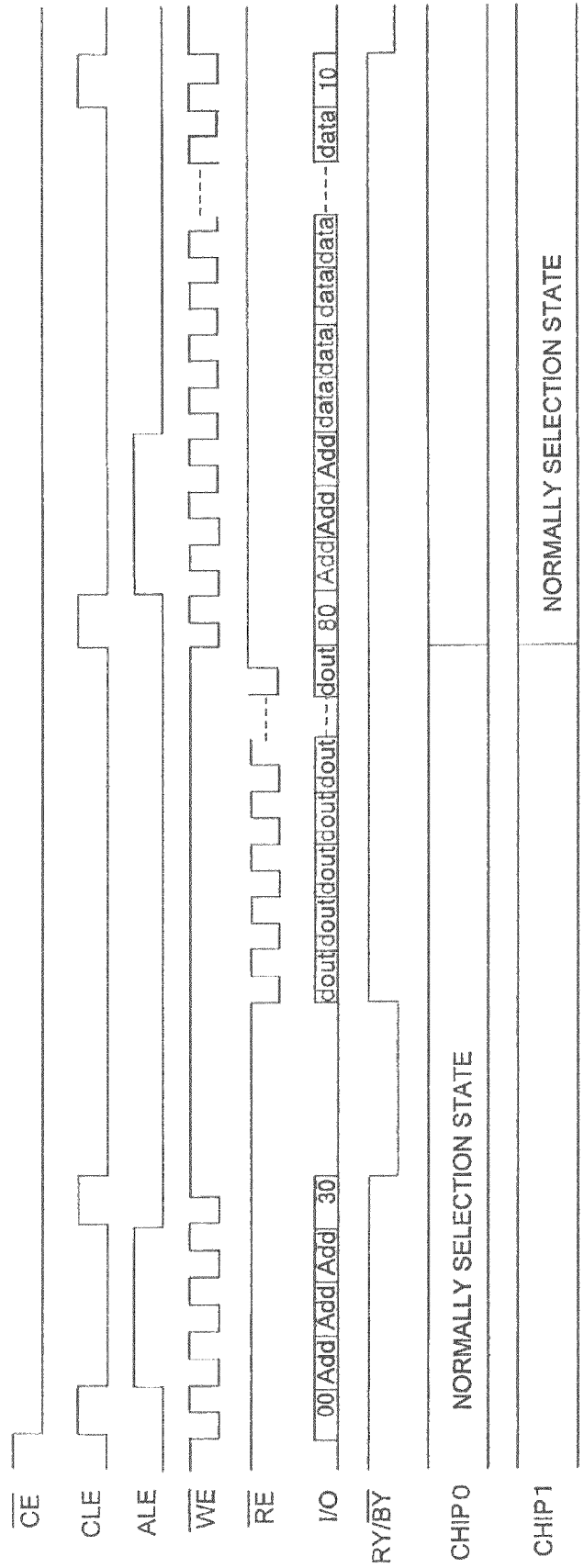
FIG. 16 is an operation sequence of the data copying among the NAND type flash memory in the nonvolatile semiconductor memory according to the related art of the first embodiment.

FIG. 16 shows an example of operation sequence according to the data copy among the NAND type flash memories in the nonvolatile semiconductor memory. Further in the example, all of the pins of the NAND type flash memories including /CE pin and RY or/BY pin (the outside pins) are common.

Firstly, the NAND type flash memory which is mounted on the chip "0" is set in a normally-selection state, and when a signal is sent to the CLE (command latch enable) pin, the command "00" is booted up using the I/O (input/output) pin. Next, the signal is sent to the ALE (address latch enable) pin, an address of the data which is desired to copy in the NAND type flash memory which is mounted on the chip "0" by inputting of the address ("Add") using the I/O pin. Here, the address of data which is desired to copy in the NAND type flash memory which is mounted on the chip "0". Next, the signal is sent again to the CLE pin, the readout operation of data of the NAND type flash memory which is mounted on the chip "0" is performed. During these operation, /CE pin is in a selection ("L": low level) state and the /RE pin (read enable) pin is in a non-selection ("H": high level) state, and the RY or /BY pin is in a ready (H) state (a state where the command is able to input from the outside section), the /WE (write enable) pin is in a toggle state. Here, a toggle state stands for an operation state, in which the signal is sending repeatedly and periodically. A toggle state, though it is not limited in particular, may be controlled, for instance, by the operation clock signal.

Next, the RY or /RY pin becomes a busy state. A busy state stands for a state, in which an input of command from the outside is prohibited, and in a operation status of the nonvolatile semiconductor memory except a reset command, a status command and such. During the operation, the /CE pin is in a selection (L) state, the CLE pin and the ALE pin is in a non-selection (L) state, and the /WE pin and the /RE pin are in non-selection (H) states.

In the next place, the RY or /BY pin again becomes a ready (H) state where the command is able to input from the outside section, and the /RE pin becomes a toggle state. Thereby data ("dout") is output to the buffer memory (See FIG. 15 for reference.) prepared in the outside section from the NAND type flash memory which is mounted on the chip "0" using the I/O pin. During this operation, the /CE pin is in a selection (L) state, the CLE pin and the ALE pin are in non-selection (L) states, and the /WE pin is in a non-selection (H) state.

Then, the NAND type flash memory which is mounted on the chip "1" is normally set to a selection state, the signal is sent to the CLE pin, and the command "80" is boot up using the I/O pin. Then subsequently, the signal is sent to the ALE pin, and the address is designated, in which the copy data in the NAND type flash memory which is mounted on the chip "1" is programmed by inputting the address using the I/O pin. Here, the address, in which the copy data in the NAND type flash memory which is mounted on the chip "1" is programmed, is designated by inputting three addresses. Then, the data ("data") is output to the NAND type flash memory which is mounted on the chip "1" from the buffer memory prepared in the outside section using the I/O pin. In the end, the signal is sent to the CLE pin, the data is programmed to the NAND type flash memory which is mounted on the chip "1" by booting up the command "10" using the I/O pin. During these operation, the /CE pin is in a selection (L) state, the /RE pin is in a non-selection (H) state, and the RY or /BY pin is in a ready (H) state where the command is able to input from the outside section, the /WE is in a toggle state. In this way, the nonvolatile semiconductor memory, it is necessary to store the data tentatively in the buffer memory prepared to the outside section at the time of data copying operation among the NAND type flash memories. Thus, it takes time to process the data copying operation.

In the next place, detailed description of the embodiments of the nonvolatile semiconductor memory of the present invention will be performed. The present invention, in addition, is not limited to these embodiments and are variable in a range, which the subject matter of the present invention is not deviated from.

First Embodiment

Figure 1A:
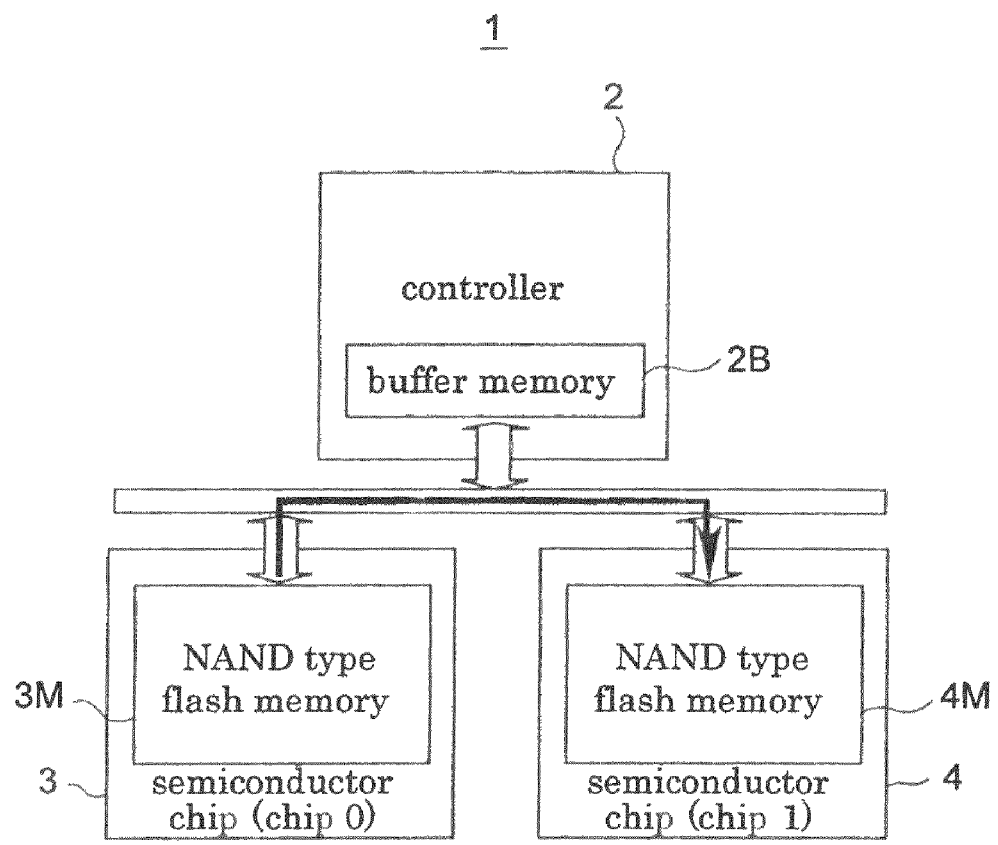
FIG. 1A is a block diagram explaining the data copying operation among a plurality of NAND type flash memories (i.e., among semiconductor memories) in the nonvolatile semiconductor memory according to the first embodiment of the present invention.

In FIG. 1A, an example of operation image according to the data copying operation among the NAND type flash memories (among the semiconductor chips) in the nonvolatile semiconductor memory according to the first embodiment is shown. In addition, in the first embodiment and the other embodiments described hereinafter, the number of the NAND type flash memories (the number of semiconductor chip) are set to be two memories. However the nonvolatile semiconductor memory according to the present invention is not limited to the number, and the number of the NAND type flash memory may be set to more than two. In particular, it is preferable that the number be that of integral multiple of "2" on constructing the memory module.

[Summary Configuration of the Nonvolatile Semiconductor Memory]

As shown in FIG. 1A, the nonvolatile semiconductor memory 1 according to the first embodiment, provides a controller 2, a semiconductor chip 3 (a semiconductor chip "0"), on which a NAND type flash memory 3M is mounted, and the semiconductor chip 4 (a semiconductor chip "1"), on which the NAND type flash memory 4M having the same structure to the NAND type flash memory 3M is mounted. These are interconnected via a system bus. In the controller 2, a buffer memory 2B is provided. In the nonvolatile semiconductor memory 1, the data which is mounted on the NAND type flash memory 3M of the semiconductor chip 3 may be sent directly to the NAND type flash memory 3M of the semiconductor chip 4. That is to say, the data output operation from the NAND type flash memory 3M and the data input operation of the NAND type flash memory 4M may be performed at a time.

Figure 1B:
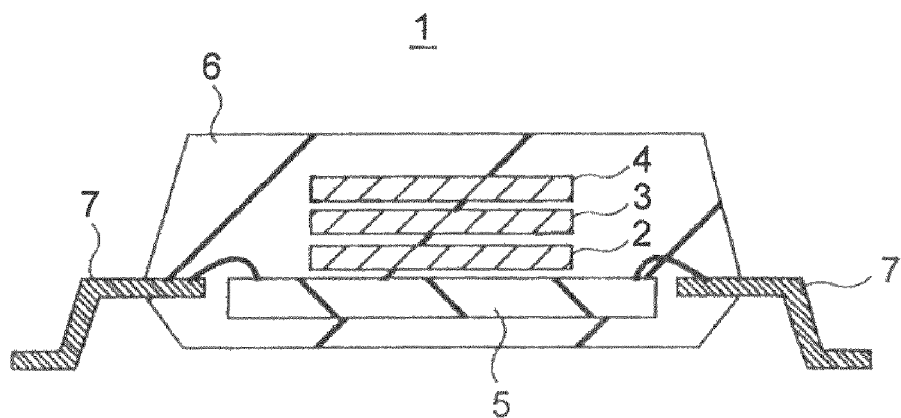
FIG. 1B is a cross section view of the nonvolatile semiconductor memory according to the first embodiment.

In FIG. 1B, an example of summary of the cross section structure of the nonvolatile semiconductor memory 1 is shown. The nonvolatile semiconductor memory 1 provides a wiring board 5, a controller 2 stacked thereon, semiconductor chips 3 and 4, a package 6 which seals the wiring board 5, the controller 2 and the semiconductor chips 3 and 4, and a pin 7. That is to say, the nonvolatile semiconductor memory 1 adopts a multi-chip module structure. One end of the pin 7 is electrically connected to the controller 2, the semiconductor chips 3 and 4 via the wiring formed on the wiring board 5. The other end is electrically connected to a terminal of electronic parts (not shown in the figure), on which the nonvolatile semiconductor memory 1 is implemented. In addition, in the first embodiment, the nonvolatile semiconductor memory 1 is configured with a stacked structure, in which the controller 2, the semiconductor chips 3 and 4 are respectively and sequentially piled up. However, the present invention is not limited to such a structure, but may be disposed on separate areas on the wiring board, without piling up. For the package 6, epoxy system resin, ceramics and such may be used practically.

In FIG. 2, an example of the pin deposition of the nonvolatile semiconductor memory 1 according to the first embodiment is shown, and a correspondence table of the abbreviated expressions and their formal nomenclatures is shown as FIG. 3.

[System Configuration of NAND Type Flash Memory]

Figure 4:
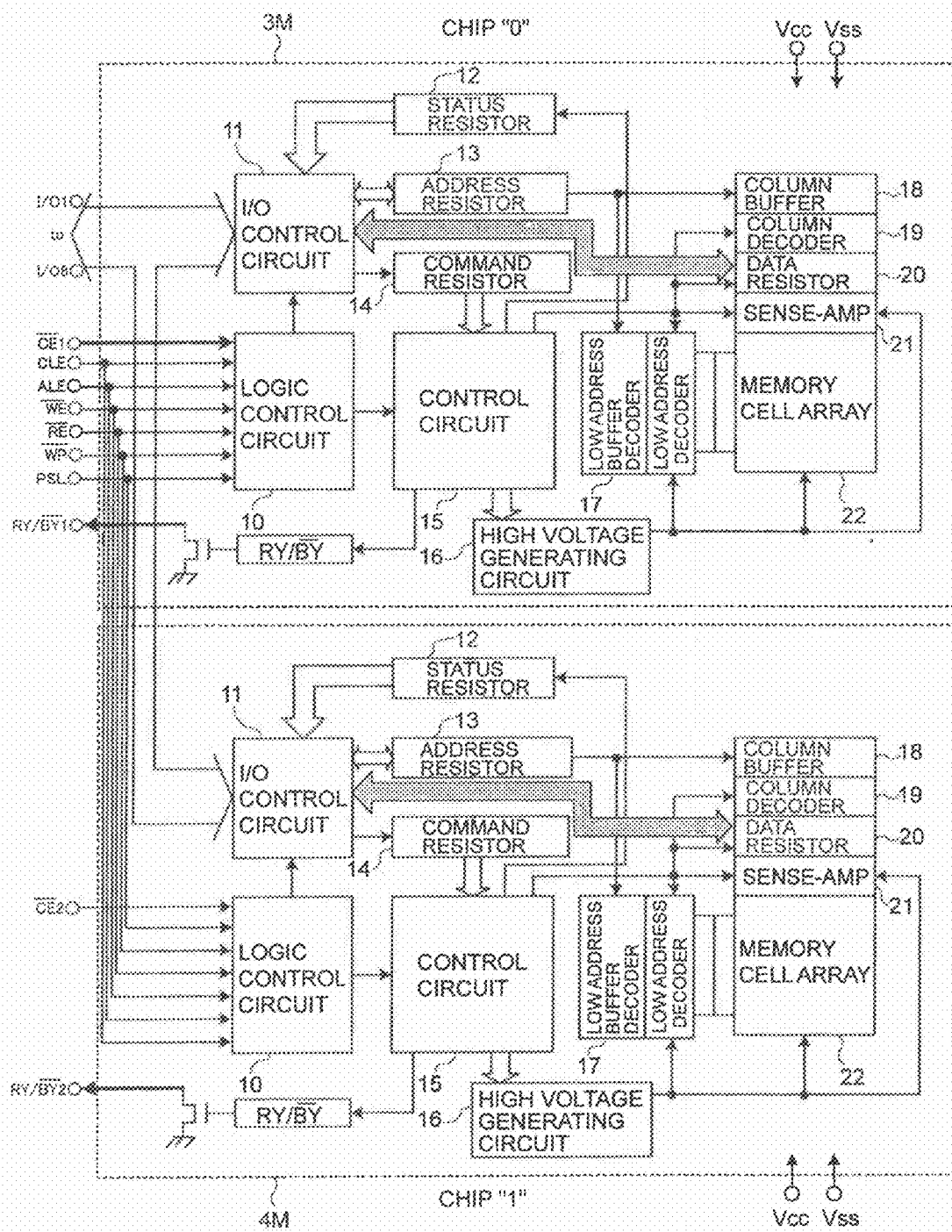
FIG. 4 is a system block diagram of the nonvolatile semiconductor memory according to the first embodiment.

In FIG. 4, an example of system configuration of the nonvolatile semiconductor memory 1 according to the first embodiment. Either of the NAND type flash memory 3M and 4M of the nonvolatile semiconductor memory 1 provides a logic control circuit 10, a I/O control circuit 11, a status register 12, an address register 13, a command register 14, a control circuit 15, a high voltage generation circuit 16, a row decoder (a row address buffer decoder and a row address decoder) 17, a column buffer 18, a column decoder 19, a data register 20, a sense amplifier 21 and a memory cell array 22. In the nonvolatile semiconductor memory 1, the /CE pin and the RY or /BY pin are provided to recognize a plurality of NAND type flash memories 3M and 4M (semiconductor chips 3 and 4) from the outside section. The /CE pin and the RY or /BY pin are deposited per the NAND type flash memories 3M and 4M. The other pins are common pins to all of the NAND type flash memories 3M and 4M. However, the nonvolatile semiconductor memory 1 according to the present invention is not always limited to such system configuration, for instance, all the pins including /CE pin and RY or /BY pins may be deposited as common pins to the NAND type flash memories 3M and 4M. In this case, recognition of the NAND type flash memory 3M and 4M may be performed.

[Data Copying Operation of NAND Type Flash Memory]

Figure 5:
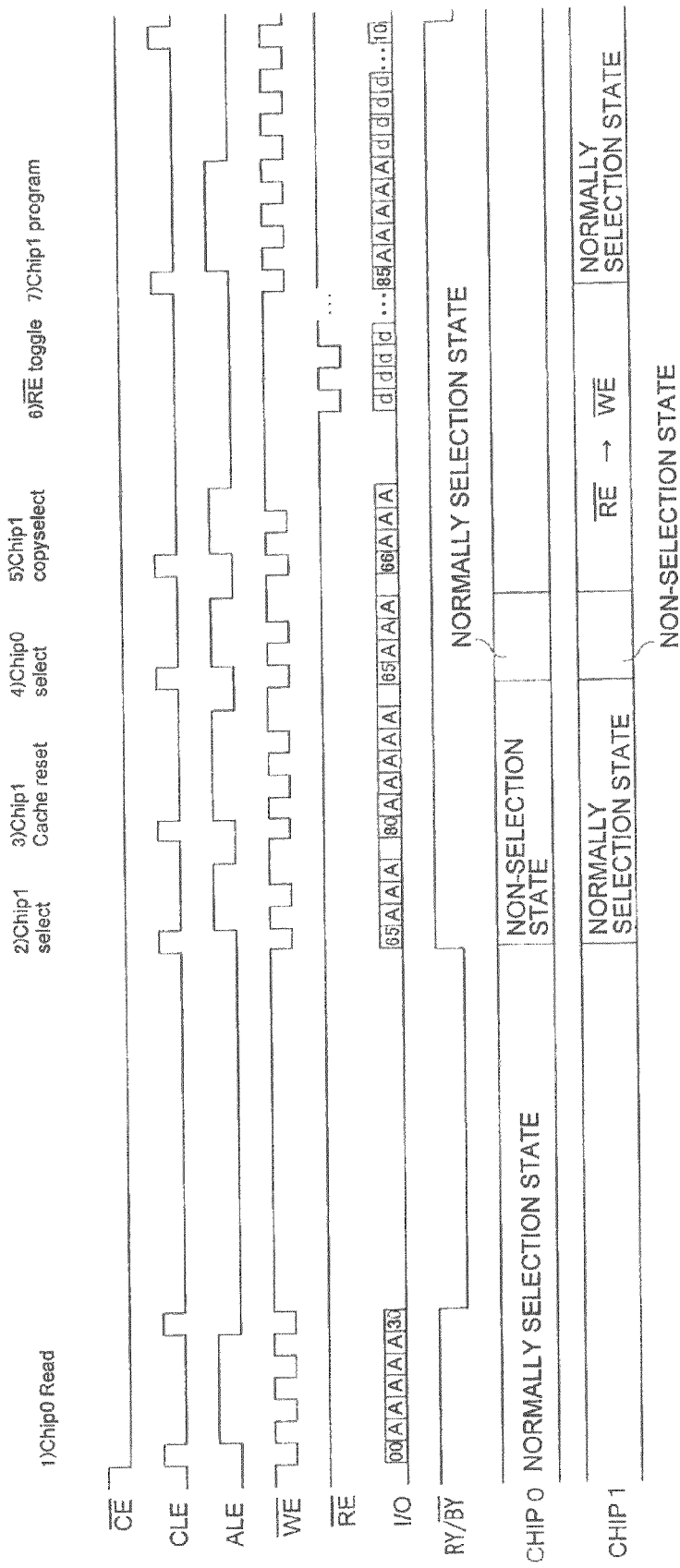
FIG. 5 is an operation sequence of data copy among a plurality of NAND type flash memories in the nonvolatile semiconductor memory according to the first embodiment.

In the next place, the data copying operation among the NAND type flash memories 3M and 4M of the nonvolatile semiconductor memory 1 according to the first embodiment. In FIG. 5, an example of operation sequence of the data copying of the nonvolatile semiconductor memory 1 is shown. In addition, in the data copying operation, all of the pins including the /CE pin and the RY or /BY pin are set as the common pins.

Firstly, the semiconductor chip 3 (the chip "0") on which the NAND type flash memory 3M is mounted is set to a normal selection state, the signal is sent to the CLE pin, and the command "00" is booted up using the I/O pin. Next, the signal is sent to the ALE pin, the address of the data to copy in the NAND type flash memory 3M is designated by inputting of the address "A" using the I/O pin. Here, the address of the data to copy is designated by inputting the five addresses "A." Then again, the signal is sent to the CLE pin, and the data readout operation of the NAND type flash memory 3M is performed by booting up of the command "30" using the I/O pin. During these operation periods, the /CLE pin is in a selection (L) state, the /RE pin is in a non-selection (H) state, the RY or /BY pin is in a ready (H) state where the command is able to input from the outside section, and the /WE pin is in a toggle state.

Next, the RY or /BY pin becomes a busy state. A busy state is a state, in which the input of the command from the outside section is prohibited except for the reset command and the status command. The entire system of the nonvolatile semiconductor memory 1 is a operation state. During the operation period, the /CE pin is in a selection (L) state, the CLE pin and the ALE pin are in non-selection (L) states, and the /WE pin and the /RE pin are in a non-selection (H) state.

In the next place, the signal is sent to the CLE pin and a command "65" is booted up using the I/O pin. Subsequently, the signal is sent to the ALE pin, and three addresses "A" are input using the I/O pin. By these operations, the normal selection state is changed to the semiconductor chip 4 (a chip "1") on which the NAND type flash memory 4M is mounted, from the NAND type flash memory 3M. During these operation periods, the /CE pin is in a selection (L) state, the /RE pin is in a non-selection (H) state, the RY or /BY pin is in a ready (H) state where the command is able to input from the outside section, and the /WE pin is in a toggle state.

Then, the signal is sent to the CLE pin and a command "80" is booted up using the I/O pin. Then subsequently, the signal is sent to the ALE pin and five addresses "A" are input using the I/O pin. By these operation, cache of the NAND type flash memory 4M are reset. In addition, During these operation periods, the /CE pin is in a selection (L) state, the /RE pin is in a non-selection (H) state, and the RY or /BY pin is in a ready (H) state where the command is able to input from the outside section, and the /WE is in a toggle state.

Next, the signal is sent to the CLE pin, a command "65" is booted up using the I/O pin. Then subsequently, the signal is sent to the ALE pin, and three addresses "A" are input using the I/O pin. By these operation, the normal selection state is changed to the NAND type flash memory 3M from the NAND type flash memory 4M. During these operation periods, the /CLE pin is in a selection (L) state, the /RE pin is in a non-selection (H) state, the RY or /BY pin is in a ready (H) state where the command is able to input from the outside section, and /WE pin is in a toggle state.

Next, the signal is sent to the CLE pin and a command "66" is booted up using the I/O pin. Then subsequently, the signal is sent to the ALE pin and three addresses "A" are input using the I/O pin. By these operation, when the /RE pin is in a toggle state the data input to the NAND type flash memory 4M (chip "1") may be recognized. During these operation periods, the /CLE pin is in a selection (L) state, the /RE pin is in a non-selection (H) state, the RY or /BY pin is in a ready (H) state where the command is able to input from the outside section, and /WE pin is in a toggle state.

Then, when the /RE pin is in a toggle state, the output of data "d" and the input of data "d" are performed at a time using the I/O pin. During these operation periods, the /CLE pin is in a selection (L) state, the CLE pin and the ALE pin are in a non-selection (L) state, the /WE pin is in a non-selection (H) state, and the RY or/BY pin is in a ready (H) state where the command is able to input from the outside section Then, the NAND type flash memory 4M is set to a normal selection state, the signal is sent to the CLE pin, and a command "85" is booted up using the I/O pin. Subsequently, the signal is sent to the ALE pin, and the address to program the copy data in the NAND type flash memory 4M is designated by inputting the address "A" using the I/O address. Here, five addresses "A" in the NAND type flash memory 4M are input and thereby the address to program the copy data is designated by inputting five addresses "A" is input. Next, data "d" is input to the NAND type flash memory 4M using the I/O pin. In addition, the input operation of the data "d" to the NAND type flash memory is not requisiteness and does not have to be performed. At last, the signal is sent to the CLE pin, and the data is programmed to the designated address of the NAND type flash memory 4M by booting up the command "10" using the I/O pin. During these operation periods, the /CE pin is in a selection (L) state, the /RE pin is in a non-selection (H) state, the RY or /BY pin is in a ready (H) state where the command is able to input from the outside section, and the /WE pin is in a toggle state.

In this way, according to the nonvolatile semiconductor memory 1 according to the first embodiment, it is not necessary to store the data tentatively into the buffer memory prepared in the outside section shown in FIG. 1A, and thus the data copying operation may be realized among the NAND type flash memories 3M and 4M. Therefore, the nonvolatile semiconductor memory 1 may be perform the data copy between the NAND type flash memories 3M and 4M in a short time without any limitation of the copy data capacity.

Second Embodiment

The second embodiment describes a data copying operation, which is different from the data copying operation of the nonvolatile semiconductor memory 1 according to the first embodiment. In addition, in the nonvolatile semiconductor memory 1 according to the second embodiment, the operation sequence of the data copying operation is different in part. However the other configuration is same to the configuration of the nonvolatile semiconductor memory 1 according to the first embodiment.

[Data Copying Operation of NAND Type Flash Memory]

Figure 6:
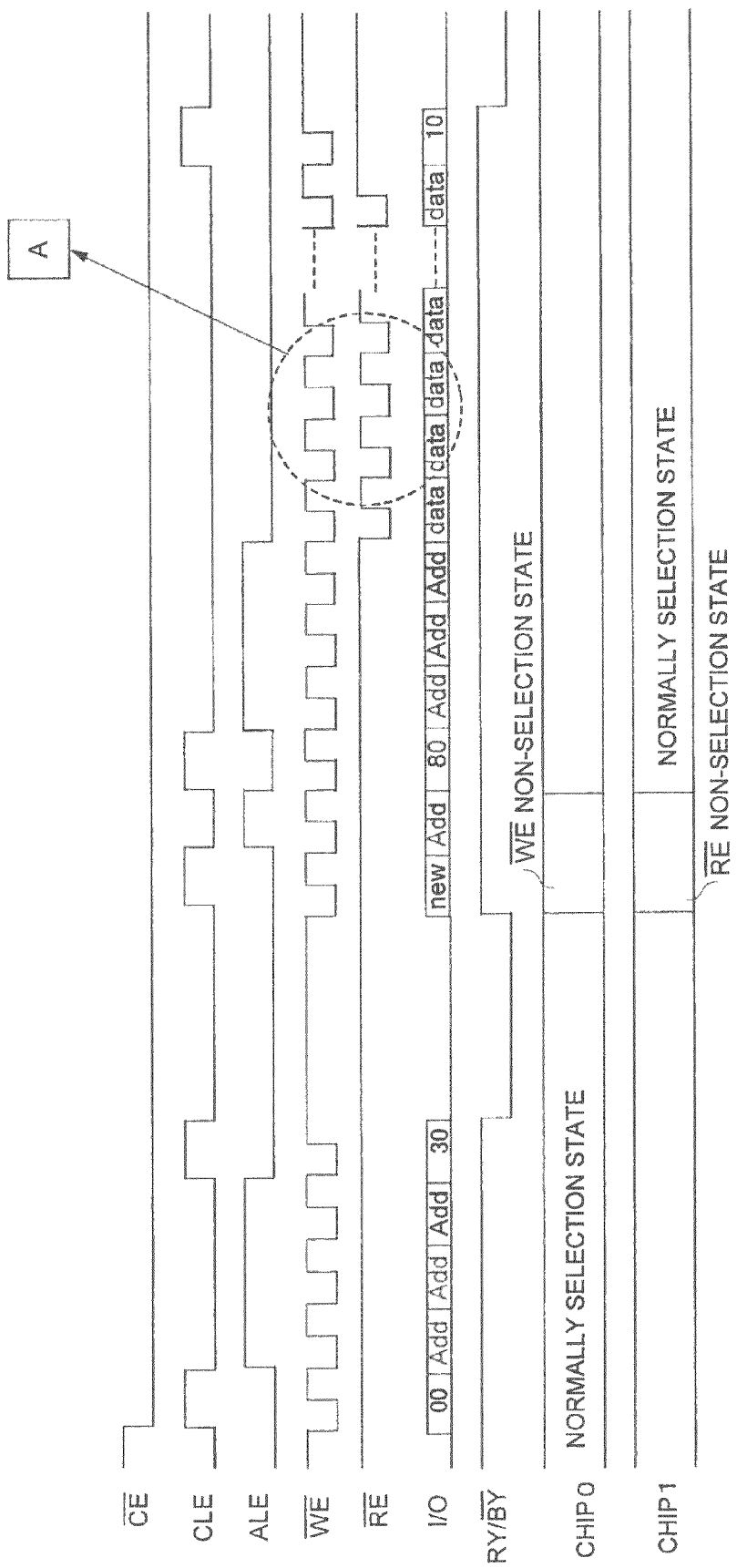
FIG. 6 is an operation sequence of data copying among the NAND type flash memories in the nonvolatile semiconductor memories according to the second embodiment of the present invention.

In FIG. 6, an example of operation sequence of the data copying operation among the NAND type flash memories 3M and 4M in the nonvolatile semiconductor memory 1 according to the second embodiment is shown. In addition, in the data copying operation, all the pins including the /CE pin and the RY or /BY pin are set as common pins.

Firstly, a NAND type flash memory 3M (a semiconductor chip 3, a chip "0") is set to be a normal selection state, the signal is sent to the CLE pin, and a command "00" is booted up using the I/O pin. Then subsequently, the signal is sent to the ALE pin, and an address of data to copy in the NAND type flash memory 3M is designated by inputting the address "Add" using the I/O pin. Here, the address of the data to copy in the NAND type flash memory 3M is designated by inputting three addresses "Add." Then subsequently, the signal is sent to the CLE pin again, and the data readout operation of the NAND type flash memory 3M is performed by booting up a command "30" using the I/O pin. During these operation periods, the /CE pin is in a selection (L) state, the /RE pin is in a non-selection (H) state, the RY or /BY pin is in a ready (H) state where the command is able to input from the outside section, and the /WE pin is in a toggle state.

Next, the RY or /BY pin is in a busy state. A busy state stands for a state, where an input of command from the outside section is prohibited except for a reset command, a status command and such. The system of the nonvolatile semiconductor memory 1 is in an operation state. During these operation periods, the /CE pin is in a selection (L) state, the CLE pin and the ALE pin is in a non-selection (L) state, and the /WE pin and /RE pin are in non-selection (H) states.

Next, the signal is sent to the CLE pin, and a command "new" is booted up using the I/O pin. Then subsequently, the signal is sent to the ALE pin and one address "Add" is input using the I/O pin. By these operation, in the NAND type flash memory 4M (semiconductor chip 4, chip "1"), the /RE pin becomes a non-selection (L) state so that no influence occurs to the inside section even if the /RE pin is set to be a toggle state. In the NAND type flash memory 3M, the /WE pin becomes a non-selection (L) state so that no influence is extend to the inside section even if the /WE pin is set to be a toggle state. During these operation periods, the /CE pin is in a selection (L) state, the /RE pin is in a non-selection (H) state and the RY or /BY pin is in a ready (H) state where the command is able to input from the outside section In the next place, the NAND type flash memory 4M is set to be a normal selection state, the signal is sent to the CLE pin and the command "80" is booted up using the I/O pin.

Then subsequently, the signal is sent to the ALE pin, and the address to program the copy data in the NAND type flash memory 4M is designated by inputting the address "Add" using the I/O pin. Here, three addresses "Add" are input, and thereby the address to program the copy data in the NAND type flash memory 4M is designated. During these operation periods, the /CE pin is in a selection (L) state, the /RE pin is in a non-selection (H) state and the RY or /BY pin is in a ready (H) state where the command is able to input from the outside section Then the /WE pin and the /RE pin are set to be a toggle state at a time. In doing so, in the NAND type flash memory 3M, the data "data" is output by setting the /RE pin being a toggle state. In the NAND type flash memory 4M, the data is input by setting the /WE pin to be in a toggle state. At last, the signal is sent to the CLE pin and the command "10" is booted up using the I/O pin, thereby the data is programmed into the NAND type flash memory 4M. During these operation periods, the /CE pin is in a selection (L) state, the ALE pin is in a non-selection (L) state and RY or /BY pin is in a ready (H) state where the command is able to input from the outside section.

Figure 7:
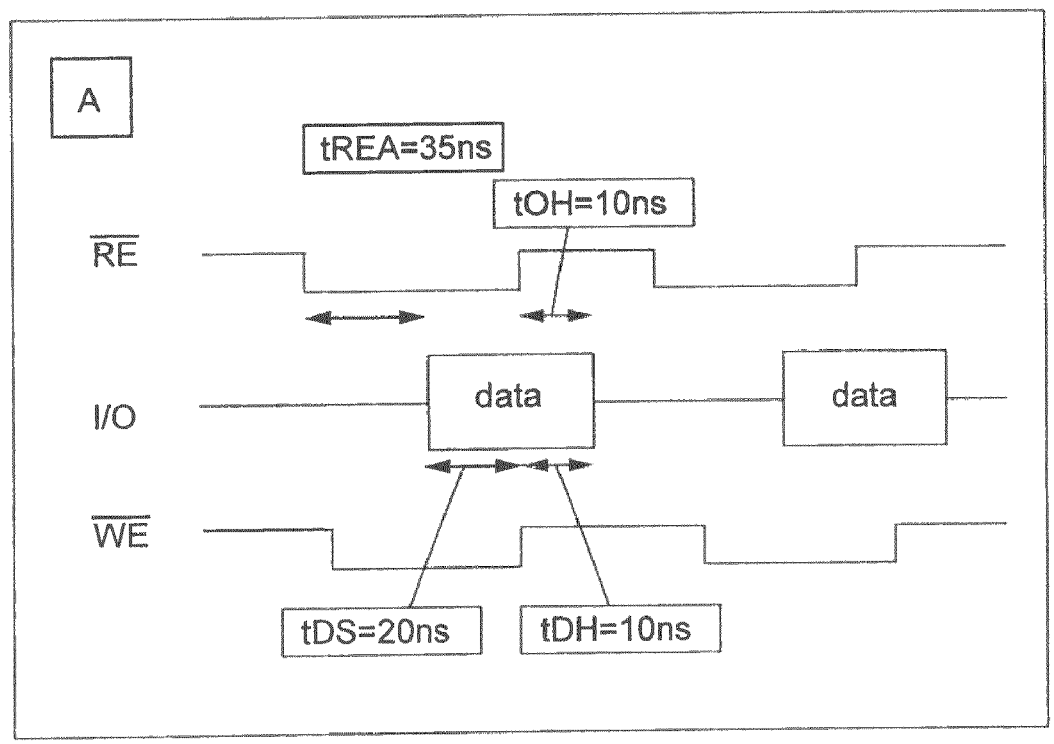
FIG. 7 is an operation sequence, in which a part, where a code A is applied to FIG. 6, is enlarged.

Here, an enlarged view of the section shown in FIG. 6 with a sign "A" is shown in FIG. 7. In FIG. 7, for convenience, an order of the /RE pin, the I/O pin and the /WE pin are replaced to those in FIG. 6. As shown in FIG. 7, in the second embodiment, for instance, it is respectively set that the /RE accessing time (tREA) be 35 ns, the data setting up time (tDS) be 20 ns, the data output maintaining time (tOH) be 10 ns, and the data maintaining time (tDH) be 10 ns.

Thus, according to the nonvolatile semiconductor memory 1 according to the second embodiment it is not necessary to store the data tentatively into the buffer memory prepared in the outside section shown in FIG. 1A, and the data copying operation may be realized among the NAND type flash memories 3M and 4M. Therefore, the nonvolatile semiconductor memory 1 may perform the data copy between the NAND type flash memories 3M and 4M in a short time without limitation of the copy data capacity.

Third Embodiment

The third embodiment of the present invention describes a data copying operation which is different from the data copying operation of the nonvolatile semiconductor memory 1 according to the first and second embodiment. In addition, in the nonvolatile semiconductor memory 1 according to the second embodiment, the operation sequence of the data copying operation is different in part. However, the other configuration is the same to the configuration of the nonvolatile semiconductor memory 1 according to the first embodiment.

[Data Copying Operation of NAND Type Flash Memory]

Figure 8:
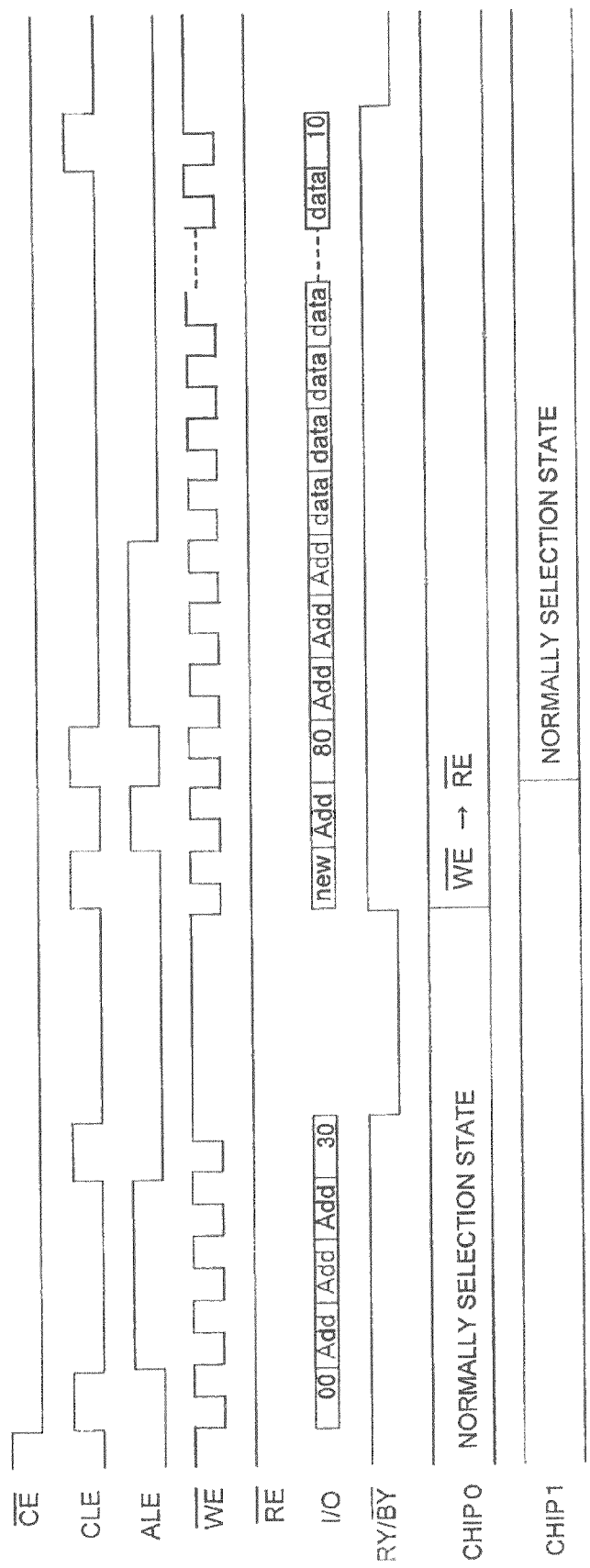
FIG. 8 is an operation sequence of data copying among the plurality of NAND type flash memories in the nonvolatile semiconductor memory according to the third embodiment of the present invention.

In FIG. 8, an example of operation sequence of the data copying operation among the NAND type flash memories 3M and 4M in the nonvolatile semiconductor memory 1 according to the third embodiment is shown. In addition, in the data copying operation, the /CE pin and all of the pins are set as common pins including the RY or /BY pin.

At first, the NAND type flash memory 3M (a semiconductor chip 3, a chip "0") is set to be a normal selection state, the signal is sent to the CLE pin, and a command "00" is booted up using the I/O pin. Subsequently the signal is sent to the ALE pin and an address of data to copy in the NAND type flash memory 3M is designated by inputting the address "Add" using the I/O pin. Here, three addresses "Add" are input, and thereby the address of the data to copy in the NAND type flash memory 3M is designated. Then subsequently, the signal is sent to the CLE pin again and the readout operation of the data of the NAND type flash memory 3M is performed by booting up the command "30" using the I/O pin. During these operation periods, the /CE pin is in a selection (L) state, the /RE pin is in a non-selection (H) state, the RY or /BY pin is in a ready (H) state where the command is able to input from the outside section and the /WE pin is in a toggle state.

Next, the RY or /BY pin is set to be a busy state. A busy state stands for a state where an input of command from the outside section is prohibited except for a reset command, a status command and such. The system of the nonvolatile semiconductor memory 1 is in an operation state. During these operation periods, the /CE pin is in a selection (L) state, the CLE pin and the ALE pin are in non-selection (L) states, and the /WE pin and the /RE pin are in non-selection (H) states.

Then, the signal is sent to the CLE pin and a command "new" is booted up using the I/O pin. Then subsequently, the signal is sent to the ALE pin and one address "Add" is input using the I/O pin. By these operations, in the NAND type flash memory 3M, when the /WE pin is set to be a toggle state, the /RE pin makes the /WE pin recognize that it is in a toggle state. During these operation periods, the /CE pin is in a selection (L) state, the /RE pin is in a non-selection (H) state, the RY or /BY pin is in a ready (H) state where the command is able to input from the outside section and the /WE pin is in a toggle state. Next, the NAND type flash memory 4M (the semiconductor chip 4, the chip "1") is set to be a normal selection state, the signal is sent to the CLE pin and the command "80" is booted up using the I/O pin. Then subsequently, the signal is sent to the ALE pin, and the address to program the copy data in the NAND type flash memory 4M is designated by inputting the address "Add" using the I/O pin. Here, three addresses "Add" are input, and thereby the address to program the copy data in the NAND type flash memory 4M is designated. During these operation periods, the /CE pin is in a selection (L) state, the /RE pin is in a non-selection (H) state, the RY or /BY pin is in a ready (H) state where the command is able to input from the outside section and the /WE pin is in a toggle state.

Further, the /WE pin is set to be a toggle state. In doing so, in the NAND type flash memory 3M, that the /WE pin is set to be a toggle state is recognized as that the /RE pin is set to be a toggle state, whereby the data is output. In the NAND type flash memory 4M, the data "data" is input by setting the /WE pin to be a toggle state. At last, the signal is sent to the CLE pin and the data is programmed to the NAND type flash memory 4M by booting up the command "10" using the I/O pin. During these operation periods, the /CE pin is in a selection (L) state, the ALE pin is in a non-selection (L) state, the /RE pin is in a non-selection (H) state, the RY or /BY pin is in a ready (H) state where the command is able to input from the outside section.

Thus, according to the nonvolatile semiconductor memory 1 according to the third embodiment, it is not necessary to store the data tentatively in the buffer memory prepared in the outside section shown in FIG. 1A, and the data copying operation may be realized among the NAND type flash memories 3M and 4M. Therefore, the nonvolatile semiconductor memory 1 may perform the data copy among the NAND type flash memories 3M and 4M in a short time.

Fourth Embodiment

The fourth embodiment of the present invention describes a data copying operation which is different from the data copying operation of the nonvolatile semiconductor memory 1 according to the first to the third embodiment. In addition, in the nonvolatile semiconductor memory 1 according to the fourth embodiment, the operation sequence of the data copying operation is different in part. However, the other configuration is the same to the nonvolatile semiconductor memory 1 according to the first embodiment.

[Data Copying Operation of NAND Type Flash Memory]

Figure 9:
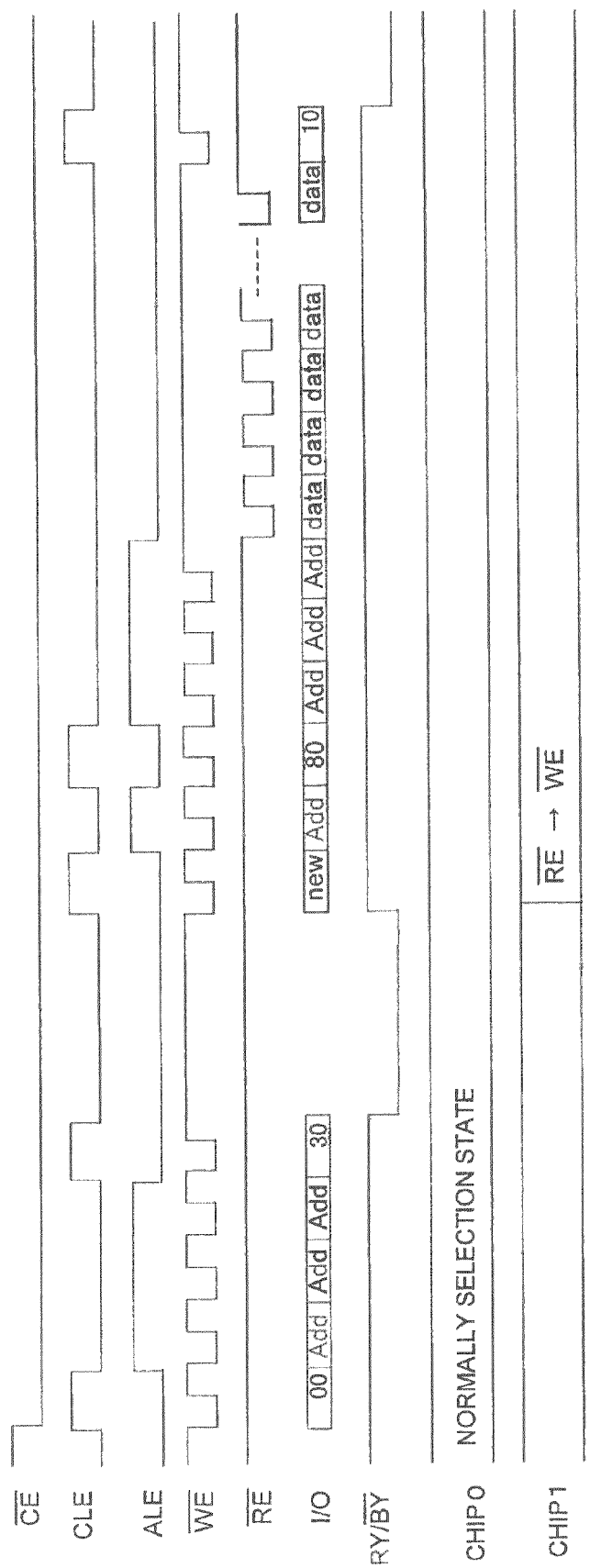
FIG. 9 is an operation sequence of data copying among the plurality of NAND type flash memory in the nonvolatile semiconductor memory according to the fourth embodiment of the present invention.

In FIG. 9, an example of operation sequence of the data copying operation among the NAND type flash memories 3M and 4M in the nonvolatile semiconductor memory 1 according to the fourth embodiment. In addition, in the data copying operation, all of the pins including the /CE pin and RY or /BY pin are set as common pins. At first, the NAND type flash memory 3M (the semiconductor chip 3, the chip "0") is set to be a normal selection state, a signal is sent to the CLE pin, the command "00" is boot up using the I/O pin. Sequentially, the signal is sent to the ALE pin, the address "Add" is input using the I/O pin, thereby the address of data to copy in the NAND type flash memory 3M is designated. Here, three addresses "Add" are input and thereby the address of data to copy in the NAND type flash memory 3M is designated. Then subsequently, the signal is sent to the CLE pin again, and the data readout operation of the NAND type flash memory 3M is performed by booting up the command "30" using the I/O pin. During these operation periods, the /CE pin is in a selection (L) state, the /RE pin is in a non-selection (H) state, the RY or /BY pin is in a ready (H) state where the command is able to input from the outside section and the /WE pin is in a toggle state.

Next, the RY or /BY pin is set to be a busy state. A busy state stands for a state where an input from the outside section is prohibited except for a reset command, a status command and such. The system of the nonvolatile semiconductor memory 1 is in an operation state. During the operation period, the /CE pin is in a selection (H) state, the CLE pin is in a non-selection (L) state and the /WE and the /RE pin are in non-selection (H) states.

Then, the signal is sent to the CLE pin and a "new" command is boot up using the I/O pin. Subsequently, the signal is sent to the ALE pin, and one address "Add" is input using the I/O pin. By these operation, in the NAND flash memory 4M (the semiconductor chip 4, the chip "1"), when the /RE pin is set to be a toggle state, the /WE pin is recognized as being in a toggle state. During these operation periods, the /CE pin is in a selection (L) state, the /RE pin is in a non-selection (H) state, the RY or /BY pin is in a ready (H) state where the command is able to input from the outside section and the /WE pin is in a toggle state.

Then the signal is sent to the CLE pin and a command "80" is booted up using the I/O pin. Then subsequently, the signal is sent to the ALE pin and an address to program the copy data in the NAND type flash memory is designated by inputting the address "Add" using the I/O pin. Here, three addresses are input, and thereby the address to program the copy data in the NAND type flash memory is designated. During these operation periods, the /CE pin is in a selection (L) state, the /RE pin is in a non-selection (H) state, the RY or /BY pin is in a ready (H) state where the command is able to input from the outside section and the /WE pin is in a toggle state.

In the next place, the /RE pin is set to be a toggle state. In doing so, in the NAND type flash memory 3M, the data is output by setting the /RE pin to be a toggle state. In the NAND type flash memory 4M, that the /RE pin is set to be the toggle state is recognized that the /WE pin is set to be the toggle state, whereby the data "data" is input. During these operation periods, the /CE pin is in a selection (L) state, the CLE pin and the ALE pin are in a non-selection (L) state, the /WE pin is in a non-selection (H) state, and the RY or /BY pin is in a ready (H) state where the command is able to input from the outside section At last, the signal is sent to the CLE pin and the command "10" is booted up, whereby the data is programmed to the NAND type flash memory by booting up the command "10". During these operation periods, the /CE pin is in a selection (L) state, the /ALE pin is in a non-selection (H) state, the /RE pin is in a non-selection state, the RY or /BY pin is in a ready (H) state where the command is able to input from the outside section and the /WE pin is in a toggle state.

Thus, according to the nonvolatile semiconductor memory 1 according to the fourth embodiment, it is not necessary to store data tentatively in the memory buffer prepared in the outside section shown in FIG. 1A, and the data copying operation may be realized among the NAND type flash memories 3M and 4M. Therefore, the nonvolatile semiconductor memory 1 may perform the data copy among the NAND type flash memories 3M and 4M in a short time without any limitation of the copy data capacity.

Fifth Embodiment

The fifth embodiment of the present invention describes the data copying operation which is different from the data copying operation of the nonvolatile semiconductor memory 1 according to the first to fourth embodiment. In addition, in the nonvolatile semiconductor memory 1 according to the fifth embodiment, the operation sequence of the data copying operation is different in part. However, the other configuration is the same to the nonvolatile semiconductor memory 1 according to the first embodiment.

[Summary Configuration of Nonvolatile Semiconductor Memory]

Figure 10:
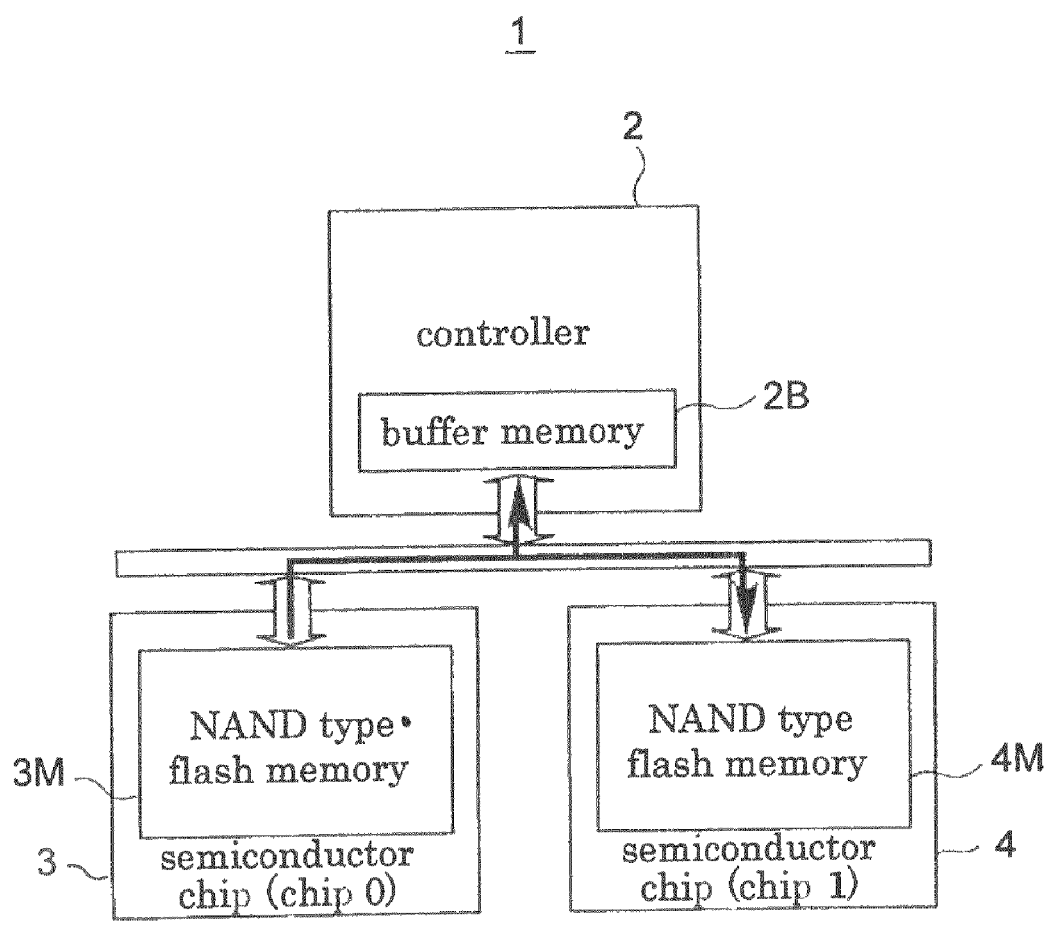
FIG. 10 is a block diagram explaining an operation of data copying among the plurality of NAND type flash memories in the nonvolatile semiconductor memory according to the fifth embodiment of the present invention.

In FIG. 10, an example of operation image of the data copying operation among the NAND type flash memories 3M and 4M in the nonvolatile semiconductor memory 1 according to the fifth embodiment. In the nonvolatile semiconductor memory 1, data may be sent directly to the NAND type flash memory 4M (the semiconductor chip 4, the chip "1") from the NAND type flash memory 3M (the semiconductor chip 3, the chip "0"). In the meantime, the copy data may be output to the buffer memory 2B of the controller 2 prepared in the outside section.

[Copying Operation of NAND Type Flash Memory]

Figure 11:
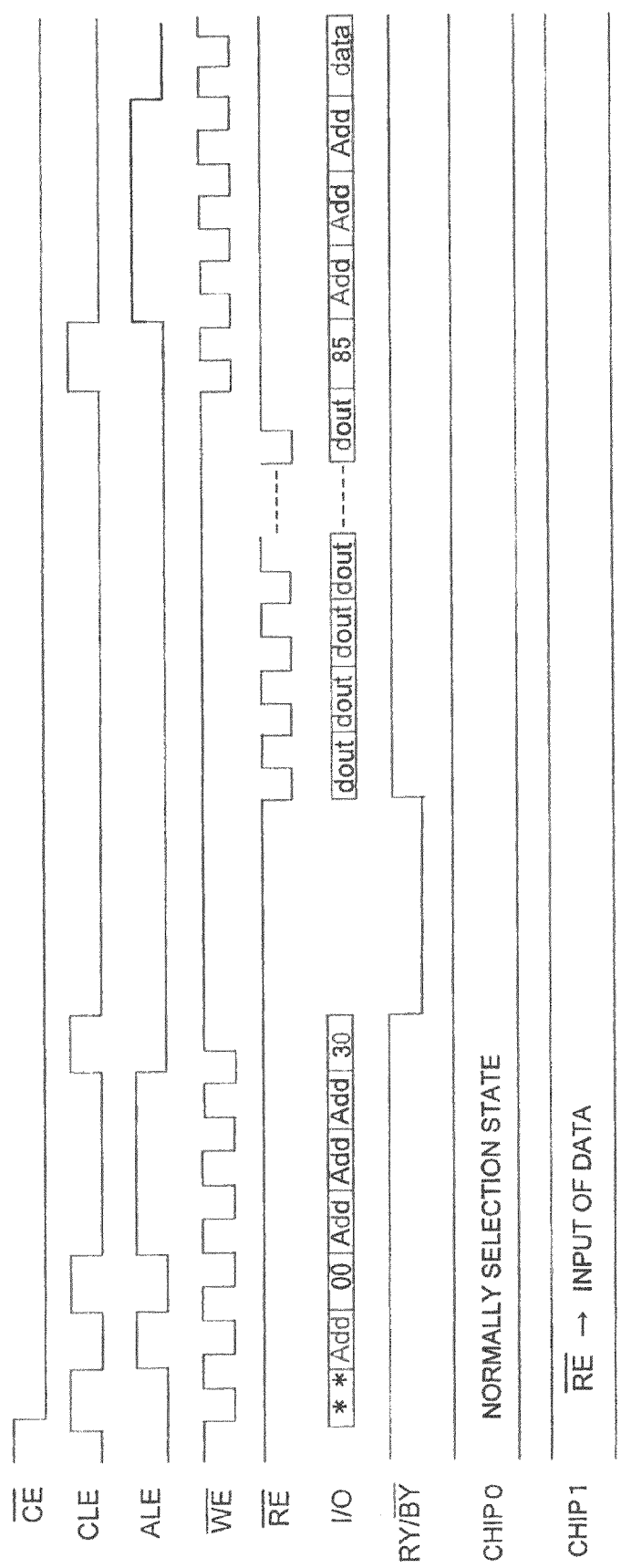
FIG. 11 is an operation sequence of the data copying among the plurality of NAND type flash memories in the nonvolatile semiconductor memories according to the fifth embodiment.

In FIG. 11, an example of the operation sequence of the data copying operation among the NAND type flash memories 3M and 4M in the nonvolatile semiconductor memory 1 according to the fifth embodiment. In addition, in the data copying operation, all the pins including the /CE pin and the RY or /BY pin are set as common pin.

At first, the NAND type flash memory 3M (the semiconductor chip 3, the chip "0") is set to be a normal selection state, a signal is sent to the CLE pin and the command "*" is booted up using the I/O pin. Then subsequently, the signal is sent to the ALE pin and one address "Add" is input using the I/O pin. By these operation, data readout operation of the NAND type flash memory is performed. Then, when the /RE pin is set to be a toggle state, the NAND type flash memory 4M (the semiconductor chip 4, the chip "1") is recognized as a data input. During these operation periods, the /CE pin is in a selection (L) state, the /RE pin is in a non-selection (H) state, the RY or /BY pin is in a ready (H) state where the command is able to input from the outside section and the /WE pin is in a toggle state.

Next, the signal is sent to the CLE pin and the command "00" is booted up using the I/O pin. Then subsequently, the signal is sent to the ALE pin and the address "Add" is input using the I/O pin, whereby the address of the data desired to copy in the NAND type flash memory 3M is designated. Here, three addresses "Add" are input, whereby the address of the data desired to copy in the NAND type flash memory 3M is designated. Then subsequently, the signal is sent to the CLE pin again and the command "30" is booted up using the I/O pin, whereby the data readout operation of the NAND type flash memory 3M is performed. During these operation periods, the /CE pin is in a selection (L) state, the /RE pin is in a non-selection (H) state, the RY or /BY pin is in a ready (H) state where the command is able to input from the outside section and the /WE pin is in a toggle state.

Then, the RY or /BY pin is set to be a busy state. A busy state stands for a state, in which an input of command from the outside is prohibited except a reset command, a status command and such. The system of the nonvolatile semiconductor memory is in an operation state. During the operation periods, the /CE pin is in a selection (L) state, the CLE pin and the ALE pin is in a non-selection (L) state, and the /WE pin and the /RE pin are in non-selection (H) states.

Further, the RY or /BY pin is set to be a ready (H) state where the command can be input from the outside section, and the /RE pin becomes a toggle state, whereby the data "dout" is output from the NAND type flash memory using the I/O pin. The data which is output from the NAND type flash memory 3M is input to the NAND type flash memory 4M (the semiconductor chip 4, the chip "1") by setting the /RE to be a toggle state. In the meantime, the data is input to the buffer memory 2B prepared to the outside section. During these periods, the /CE pin is in a selection (L) state, the CLE pin and the ALE pin are in a non-selection (L) state and the /WE pin is in a non-selection (H) state.

Then, signal is sent to the CLE pin and the command "85" is booted up using the I/O pin. Then subsequently, the signal is sent to the ALE pin and the address "Add" is input using the I/O pin, whereby the address to program the copy data in the NAND type flash memory 4M is designated. Here, three address "Add" are input, whereby the address to program the copy data in the NAND type flash memory 4M is designated. By these operations, in the NAND type flash memory 4M, the data is overwritten remaining the input data. Then subsequently, the data "data" is input to the NAND type flash memory 4M from the buffer memory 2B prepared in the outside section using the I/O pin. During these operation periods, the /CE pin is in a selection (L) state, the /RE pin is in a non-selection (H) state, the RY or /BY pin is in a non-selection (H) state and the /WE pin is in a toggle state.

Thus, in the nonvolatile semiconductor memory 1 according to the fifth embodiment, the data may be inputs and corrects to the NAND type flash memory 4M from the buffer memory 2B prepared in the outside section, in case the correction of the data which is input to the NAND type flash memory is required by ECC (error checking and correcting).

Sixth Embodiment

Sixth embodiment of the present invention describes a data copying operation which is different from the data copying operation of the nonvolatile semiconductor memory 1 according to the fifth embodiment. In addition, in the nonvolatile semiconductor memory 1 according to the sixth embodiment, the operation sequence of the data copying operation is different in part. However, the other configuration is the same to that of the nonvolatile semiconductor memory 1 according to the first embodiment.

(Data Copying Operation of NAND Type Flash Memory)

Figure 12:
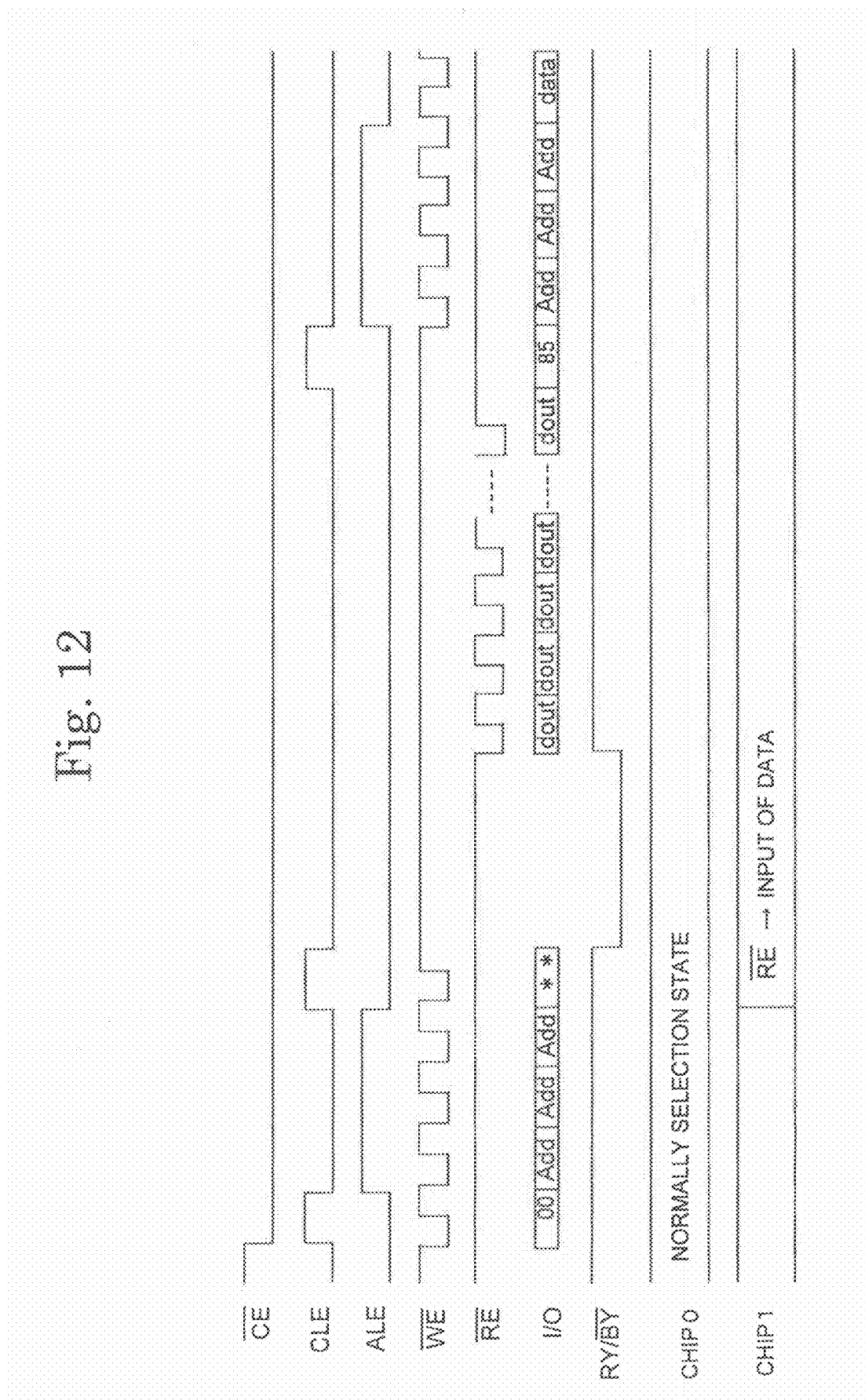
FIG. 12 is the operation sequence of the data copying among the plurality of NAND type flash memories in the nonvolatile semiconductor memory according to the sixth embodiment of the present invention.

In FIG. 12, an example of the operation sequence of the data copying operation among the NAND type flash memories 3M and 4M in the nonvolatile semiconductor memory 1 according to the sixth embodiment. In addition, in the data copying operation, all of the pins including the /CE pin and the RY or /BY pin are set as common pin.

At first, the NAND type flash memory 3M (the semiconductor chip 3, the chip "0") is set to be a normal selection state, a signal is sent to the CLE pin and the command "00" is booted up using the I/O pin. Then, the signal is sent to the ALE pin and the address "Add" is input using the I/O pin, whereby the address of data which is desired to copy in the NAND type flash memory 3M is designated. Here, three addresses "Add" are input, whereby the address of data which is desired to copy in the NAND type flash memory is designated. During these operation periods, the /CE pin is in a selection (L) state, the /RE pin is in a non-selection (H) state, the RY or /BY pin is in a ready (H) state where the command is able to input from the outside section and the /WE pin is in a toggle state.

Next, the signal is sent to the CLE pin and the command "*" is booted up using the I/O pin. By these operation, the data readout of the NAND type flash memory 3M is performed. Then, when the /RE pin becomes a toggle state, the NAND type flash memory 4M (the semiconductor chip 4, the chip "1") is recognized as a data input. During these operation periods, the /CE pin is in a non-selection (L) state, the /RE pin is in a non-selection (H) state, the RY or /BY pin is in a ready (H) state where the command is able to input from the outside section and the /WE pin is in a toggle state.

Then, the RY or /BY pin is set to be a busy state. A busy state stands for a state where an input of command from the outside section is prohibited except for a reset command, a status command and such. The system of the nonvolatile semiconductor memory 1 is in an operation state. During these operation periods, the /CE pin is in a selection (L) state, the CLE pin and the ALE pin is in a non-selection (L) state, and the /WE pin and /RE pin are in non-selection (H) states. The system of the nonvolatile semiconductor memory 1 is in an operation state. During these operation periods, the /CE pin is in a selection (L) state, the /CLE pin and the /ALE pin is in non-selection (L) state and the /WE pin and the /RE pin are in non-selection (H) state.

Then, the RY or /BY pin is set to be a ready (H) state again, where the command is able to input from the outside section and the /RE pin is set to be a toggle state, whereby the data "dout" is output from the NAND type flash memory using the I/O pin. The data which is output from the NAND type flash memory 3M is input to the NAND type flash memory 4M (the semiconductor chip 4, the chip "1") by setting the /RE pin to be a toggle state. In the meantime, the data is also input to the buffer memory 2B prepared in the outside section. During these operation period, the /CE pin is in a selection (L) state, the CLE pin and the ALE pin is in a non-selection (L) state and the /WE pin is in a non-selection (H) state.

In the next place, the signal is sent to the CLE pin and the command "85" is booted up using the I/O pin. Then subsequently, the signal is sent to the ALE pin and the address "Add" is input using the I/O pin, whereby the address to program the copy data in the NAND type flash memory 4M (the semiconductor chip 4, the chip "1") is designated. Here, three addresses "Add" are input, whereby the address to program the copy data of the NAND type flash memory 4M is designated. By these operations, in the NAND type flash memory 4M, the data may be overwritten remaining the input data. Then subsequently, the data "data" is input to the NAND type flash memory 4M from the buffer memory 2B prepared in the outside section using the I/O pin. During these operation periods, the /CE pin is in a selection (L) state, the /RE pin is in a non-selection (H) state, the RY or /BY pin is in a ready (H) state where the command is able to input from the outside section and the /WE pin is in a toggle state.

Thus, in the nonvolatile semiconductor memory 1 according to the sixth embodiment, the data may be inputs and corrects to the NAND type flash memory 4M from the buffer memory 2B prepared in the outside section, in case correction of the data which is input in the NAND type flash memory 4M by ECC.

Seventh Embodiment

In the nonvolatile semiconductor memory 1 according to the above-described first to the sixth embodiments, examples have been described, where two NAND type flash memories 3M and 4M (two semiconductor chip 3 and 4) are implemented. However, the present invention is not limited to the number but more than two NAND type flash memories may be implemented.

[Summary Configuration of Nonvolatile Semiconductor Memory]

Figure 13:
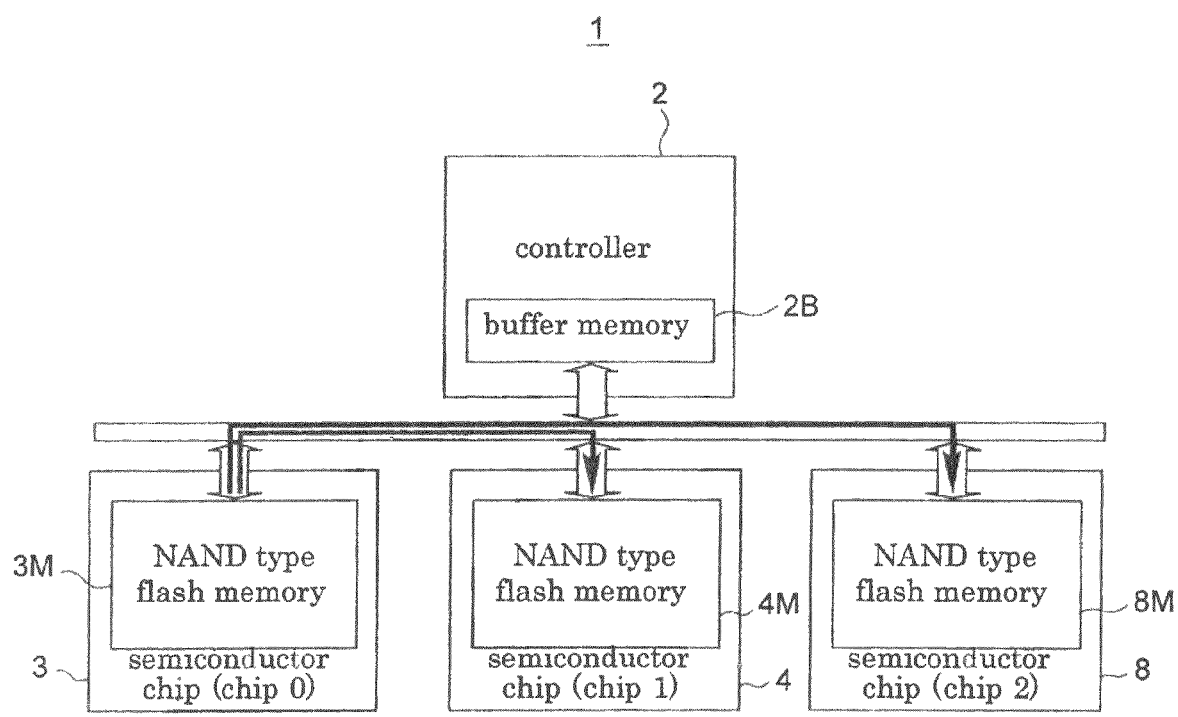
FIG. 13 is a block diagram explaining the operation of data copying among the plurality of NAND type flash memories in the nonvolatile semiconductor memory according to the seventh embodiment of the present invention.

In FIG. 13, an example of an operation image of the data copying operation among the NAND type flash memories (the semiconductor chips) in the nonvolatile semiconductor memory 1 according to the seventh embodiment is shown. The nonvolatile semiconductor memory 1 further provides a semiconductor chip 8 (a chip "2"), on which the NAND type flash memory 8M is mounted, in the nonvolatile semiconductor memory 1 according to the first embodiment 1 shown in the above described FIG. 1A. In the nonvolatile semiconductor memory 1, data may be sent directly to the NAND type flash memory 4M (a chip "1") and the NAND type flash memory 8M (the chip "2") from the NAND type flash memory 3M (the chip "0"). That is to say, a data outputting operation from the NAND type flash memory 3M and a data inputting operation of the NAND type flash memory 4M may be performed at a time. Also, either that only the data copy (A) is performed to the NAND type flash memory 4M from the NAND type flash memory 3M, or that only the data copy (B) is performed to the NAND type flash memory 8M from the NAND type flash memory 3M, is possible. Further, at the same time that the data copy (A) is performed to the NAND type flash memory 4M from the NAND type flash memory 3M, that the data copy (B) is performed to the NAND type flash memory 8M from the NAND type flash memory 3M is possible.

Eighth Embodiment

The eighth embodiment of the present invention describes the data copying operation which is different from the data copying operation of the nonvolatile semiconductor memory 1 according to the first to the seventh embodiment. In particular, the eighth embodiment describes an example, where in the data copying operation, switching among the NAND type flash memories 3M and 4M may be implemented by the CE pin (chip enable signal). In addition, in the nonvolatile semiconductor memory 1 according to the eighth embodiment, the operation sequence of the data copying operation is different in part. However, the other configuration is the same to the nonvolatile semiconductor memory 1 according to the first embodiment.

Figure 14:
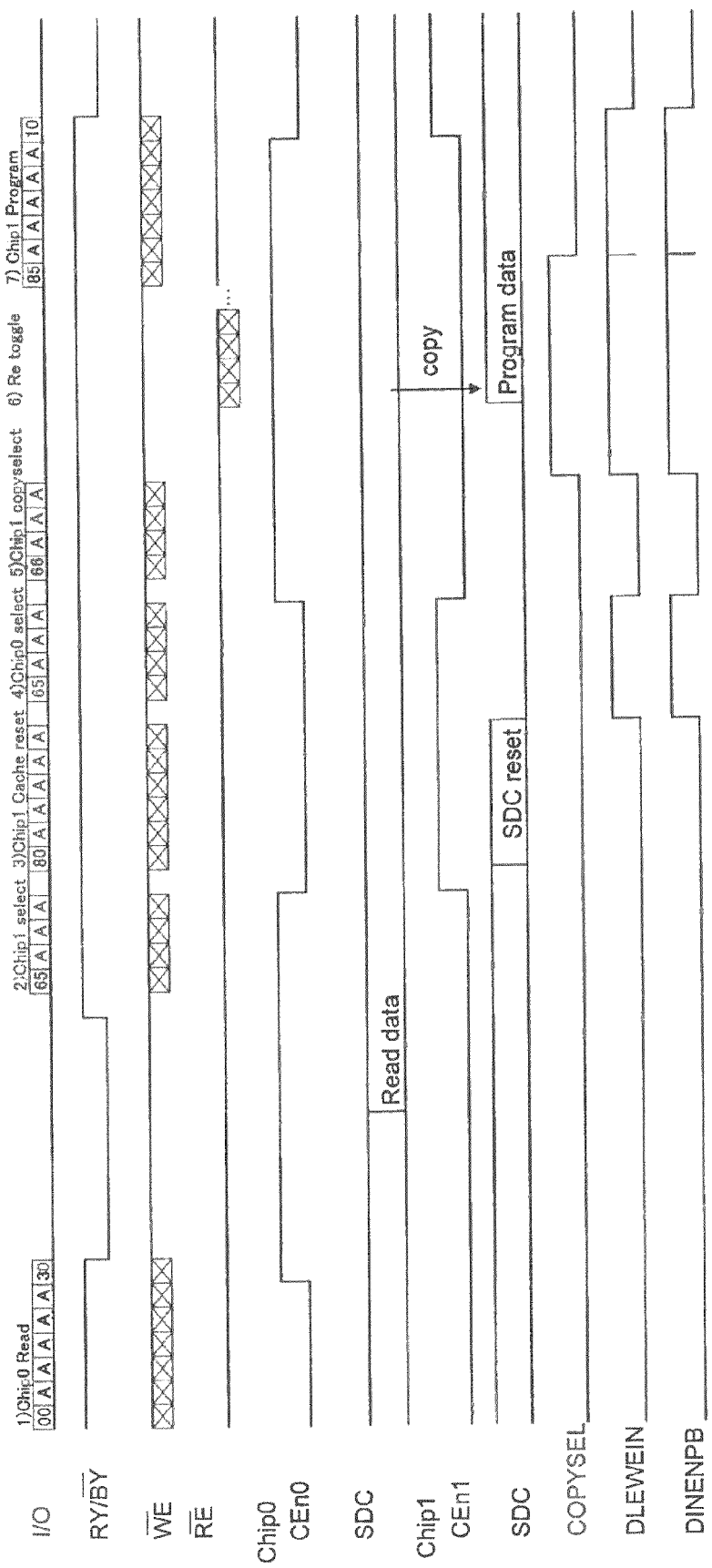
FIG. 14 is the operation sequence of the data copying among the plurality of NAND type flash memories in the nonvolatile semiconductor memory according to the eighth embodiment of the present invention.

In FIG. 14, an example of the operation sequence of the data copying operation among the NAND type flash memories 3M and 4M is shown in the nonvolatile semiconductor memory 1 according to the eighth embodiment. In addition, in the data copying operation, a plurality of /CE pins and a plurality of RY or /BY pins are deposited in proportion to the number of the NAND type flash memories 3M and 4M, and all of other pins are set as common pins.

Firstly, the /CEn0 pin of the NAND type flash memory 3M (the semiconductor chip 3, the chip "0") is set to be a non-selection (H) state, and the CE n1 pin of the NAND type flash memory 4M (the semiconductor chip 4, the chip "1") is set to be a selection (L) state. The command "80" is booted up using the I/O pin, and subsequently, five addresses "A" are input using the I/O pin. By these operations, cache of the NAND type flash memory 4M is reset. During these operation period, the /RE pin is in a non-selection (H) state, the RY or /BY pin is in a ready (H) state where the command is able to input from the outside section and the /WE pin is in a toggle state.

Next, the /CEn0 pin of the NAND type flash memory 3M is set to be a selection (L) and the /CEn1 pin of the NAND type flash memory 4M is set to be a non-selection (H) state. Then the command "00" is booted up using the I/O pin. Subsequently, the address "A" is input, whereby the data of address which is desired to copy in the NAND type flash memory 3M is read out. Here, five addresses are input, whereby the address of data which is desired to copy in the NAND type flash memory 3M is designated. Subsequently, the command "30" is booted up using the I/O command, whereby the data readout of the NAND type flash memory 3M is performed. During these operation period, the /RE pin is in a non-selection (L) state, the RY or /BY pin is in a ready (H) state where the command is able to input from the outside section and the /WE pin is in a toggle state.

Next, the RY pin or BY pin is set to be a busy state. A busy state stands for a state, where the input of command from the outside section is prohibited except for a reset command, a status command and such. The system of the nonvolatile semiconductor memory 1 is in an operation state. During these operation period, the /CEn0 pin is in a selection (L) state, the /CEn1 pin is in a non-selection (H) state and the /WE pin and the /RE pins are in non-selection (H) states.

In the next place, the RY or /BY pin is set to be a ready state where the command is able to input from the outside section. Then the command "66" is booted up using the I/O pin; at the same time the /CEn0 pin of the NAND type flash memory 3M is set to be a non-selection (H) state and the /CEn1 pin of the NAND type flash memory 4M is set to be a non-selection (L)

state. The address "A" is input to the NAND type flash memory 4M using the I/O pin. Here, three addresses "A" are input, whereby the address of data which is desired to copy in the NAND type flash memory 4M is designated. Then subsequently, the /CEn0 pin of the NAND type flash memory 3M is set to be a selection (L) state and the /CEn1 pin of the NAND type flash memory 4M is set to be a selection (L) state at a time. Then, the data which is output from the NAND type flash memory 3M is input and copied to the NAND type flash memory 4M by setting the /RE pin to be a toggle state, meanwhile, the data is also input to the buffer memory 2B prepared in the outside section (See FIG. 13). During these operation periods, the /WE pin is in a non-selection (H) state.

Then, the /CEn0 pin of the NAND type flash memory 3M is set to be a non-selection (H) state, the /CEn1 pin of the NAND type flash memory 4M is set to be a selection (L) state and the command "85" is booted up using the I/O pin. Subsequently, the address "A" is input using the I/O pin, whereby the address to program the copy data in the NAND type flash memory 4M is designated. Here, five addresses "A" are input, whereby the address to program the copy data in the NAND type flash memory 4M is designated. By these operations, in the NAND type flash memory 4M, the data is overwritten remaining the input data. Then subsequently, a data "D" is input to the NAND type flash memory 4M from the buffer memory 2B prepared in the outside section using the I/O pin. During these operation periods, the /RE pin is in a non-selection (H) state, the RY or /BY pin is in a selection (H) state, and the /WE pin is in a toggle state.

Thus, in the nonvolatile semiconductor memory 1 according to the eighth embodiment, when correction of the data which is input to the NAND type flash memory 4M is required by ECC, the data may be inputs and corrects to the NAND type flash memory 4M from the buffer memory 2B prepared in the outside section. Further, an copying operation to copy the data of the NAND type flash memory 3M to the NAND type flash memory 4M may be performed by the chip enable (CE pin).

[Characteristics of the Embodiments]

As described above, the nonvolatile semiconductor memory 1 according to the embodiments of the present invention has the following characteristics. That is, the nonvolatile semiconductor memory 1 according to the fourth embodiment, in the NAND type flash memory 4M of the destination to be copied, the read enable operation is performed after booting up a command, in which the read enable operation is made recognize as a write enable operation, whereby the output operation of the data of the NAND type flash memory 3M of the source of the copy and the input operation of the data of the NAND type flash memory 4M of the destination to be copied may be performed at a time.

The nonvolatile semiconductor memory according to the first embodiment, when copying the data to the NAND type flash memory 4M from the NAND type flash memory 3M, in the NAND type flash memory 4M, the read enable operation is performed after booting up the command, in which the read enable operation is made recognize as the write enable operation.

The nonvolatile semiconductor memory 1 according to the fourth embodiment, in the NAND type flash memory 4M, the read enable operation is performed after the command in which the read enable operation is made recognize as the write enable operation, thereby, the output operation of the data from the NAND type flash memory 3M and the input operation of the data to the NAND type flash memory 4M are performed at a time.

The nonvolatile semiconductor memory 1 according to the second embodiment, after the command is booted up, in which the write enable operation is not made recognize in the NAND type flash memory 3M of the source of the copy and the read enable operation is not made recognize in the NAND type flash memory 4M of the destination to be copied, the read enable operation of the NAND type flash memory 3M and the write enable operation of the NAND type flash memory 4M are performed at a time. Thereby, the output operation of the data from the NAND type flash memory 3M of the source of the copy and the input operation of the data to the NAND type flash memory 4M of the destination to be copied, are performed at a time.

The nonvolatile semiconductor memory 1 according to the first embodiment, when copying the data to the NAND type flash memory 4M from the NAND type flash memory 3M, after the command is booted up, in which the read enable operation is not made recognize in the NAND type flash memory 3M and the write enable operation is not made recognize in the NAND type flash memory 4M, the read enable operation of the NAND type flash memory 3M and the write enable operation of the NAND type of the flash memory 4M are performed at a time.

The nonvolatile semiconductor memory 1 according to the second embodiment, the command, in which the write enable operation is not made recognized in the NAND type flash memory 3M and the read enable operation is not made recognize in the NAND type flash memory 4M, are booted up. Afterward, the read enable operation of the NAND type flash memory 3M and the write enable operation of the NAND type flash memory 4M are performed at a time. Thereby, the output operation of the data from the NAND type flash memory 3M and the input operation of the data to the NAND type flash memory 4M are performed at a time.

The nonvolatile semiconductor memory 1 according to the third embodiment, in the NAND type flash memory 3M of the source of the copy, the write enable operation is performed to the NAND type flash memory 3M after booting up the command in which the write enable operation is made recognize as the read enable operation. Thereby, the output operation of the data of the NAND type flash memory 3M of the source of the copy and the input operation of the data of the NAND type flash memory 4M of the destination to be copied are performed at a time.

The nonvolatile semiconductor memory 1 according to the first embodiment, when copying the data to the NAND type flash memory 4M from the NAND type flash memory 3M, in the NAND type flash memory 3M, the Write Enable operation is performed after booting up the command in which the Write Enable operation is made recognize as the Read Enable operation.

The nonvolatile semiconductor memory 1 according to the third embodiment, in the NAND type flash memory 3M, the write enable operation is performed after booting up the command in which the write enable operation is made recognize as the read enable operation. Thereby, the output operation of the data of the NAND type flash memory 3M and the input operation of the NAND type flash memory 4M are performed at a time.

The nonvolatile semiconductor memory 1 according to the fifth or sixth embodiment, in the NAND type flash memory 4M of the destination to be copied, the read enable operation is performed after booting up the command in which the read enable operation is made recognize as the data input of the NAND type flash memory 4M of the destination to be copied. Thereby, the output operation of the data of the NAND type flash memory 3M of the source of the copy and the input operation of the data of the NAND type flash memory 4M of the destination to be copied, are performed at a time. Meanwhile, the data which is output from the NAND type flash memory 3M of the source of the copy is input to the buffer memory 2B prepared in the outside section.

The nonvolatile semiconductor memory 1 according to the first embodiment, when copying the data to the NAND type flash memory 4M from the NAND type flash memory 3M, in the NAND type flash memory 3M, the read enable operation is performed after booting up the command in which the read enable operation is made recognize as the input of the data of the NAND type flash memory 4M.

The nonvolatile semiconductor memory 1 according to the fifth or the sixth embodiment, in the NAND type flash memory 3M, the read enable operation is performed after booting up the command in which the read enable operation is made recognize as the input of the data to the NAND type flash memory 4M. Thereby, the output operation of the data of the NAND type flash memory 3M and the input operation of the data of the NAND type flash memory 4M are performed at a time, meanwhile, the data which is output from the NAND type flash memory 3M is input to the buffer memory 2B prepared in the outside section.

The nonvolatile semiconductor memory 1 according to the first to the seventh embodiment share the I/O pin, the /WE pin and the /RE pin, in a plurality of semiconductor chips 3 and 4.

Thus, in the nonvolatile semiconductor memory 1 according to the present invention, the data outputting operation of the NAND type flash memory 3M (the semiconductor chip 3) of the source of the copy and the data input operation of the NAND type flash memory 4M or 8M of the destination to be copied may be performed at a time, by using the command. Therefore, the nonvolatile semiconductor 1 of the present invention may be performed the data copying operation among the NAND type flash memories in a short time.

Other Embodiments

The present invention is not limited to the above described embodiments. For instance, the present invention may be applied to the nonvolatile semiconductor memory with dynamic type random access memory (DRAM), static type random access memory (SRAM) or erasable programmable read only memory (EPROM) and so on, except for the NAND type flash memory.

The invention claimed is:

1. A semiconductor memory device comprising:
   a first semiconductor chip;
   a first nonvolatile memory provided on the first semiconductor chip;
   a second semiconductor chip;
   a second nonvolatile memory provided on the second semiconductor chip;
   a system bus which directly connects the first and second nonvolatile memories;
   a plurality of data terminals connected to the first and second nonvolatile memories through the system bus; and
   an enable terminal connected to the first and second nonvolatile memories, wherein:
   the first nonvolatile memory is configured to receive an enable signal from the enable terminal;
   the first nonvolatile memory is configured to sequentially output data to the system bus in response to the enable signal, the data including a first piece of data and a second piece of data to be output next to the first piece of data;
   the first nonvolatile memory is configured to output the first piece of data to the system bus in response to a first edge of the enable signal;
   the first nonvolatile memory is configured to output the second piece of data to the system bus in response to a second edge of the enable signal; and
   the second nonvolatile memory is configured to latch the first piece of data output from the first nonvolatile memory, through the system bus, before the first nonvolatile memory outputs the second piece of data.

2. The semiconductor memory device according to claim 1, wherein the first and second nonvolatile memories are NAND type flash memories.

3. The semiconductor memory device according to claim 1, further comprising a wiring board, wherein
   the first semiconductor chip is mounted on the wiring board and the second semiconductor chip is mounted on the first semiconductor chip.

4. The semiconductor memory device according to claim 1, wherein the system bus is connected to the data terminals.

5. The semiconductor memory device according to claim 1, further comprising a command latch enable terminal connected to the first and second nonvolatile memories, wherein:
   the first and second nonvolatile memories are configured to receive a command from the data terminals;
   the first and second nonvolatile memories are configured to receive a command latch enable signal from the command latch enable terminal; and
   the first and second nonvolatile memories are configured to latch the command in response to the command latch enable signal.

6. The semiconductor memory device according to claim 1, further comprising an address latch enable terminal connected to the first and second nonvolatile memories, wherein:
   the first and second nonvolatile memories are configured to receive an address from the data terminals;
   the first and second nonvolatile memories are configured to receive an address latch enable signal from the address latch enable terminal; and
   the first and second nonvolatile memories are configured to latch the address in response to the address latch enable signal.

7. The semiconductor memory device according to claim 1, further comprising:
   a first chip enable terminal connected to the first nonvolatile memory; and
   a second chip enable terminal connected to the second nonvolatile memory, wherein:
   the first nonvolatile memory is configured to receive a first chip enable signal from the first chip enable terminal;
   the second nonvolatile memory is configured to receive a second chip enable signal from the second chip enable terminal;
   the first nonvolatile memory is configured to be enabled in response to the first chip enable signal; and
   the second nonvolatile memory is configured to be enabled in response to the second chip enable signal.

8. The semiconductor memory device according to claim 1, further comprising:
   a first ready/busy terminal connected to the first nonvolatile memory; and
   a second ready/busy terminal connected to the second nonvolatile memory, wherein:
   the first nonvolatile memory is configured to output a first ready/busy signal indicating a ready state of the first nonvolatile memory from the first ready/busy terminal; and
   the second nonvolatile memory is configured to output a second ready/busy signal indicating a ready state of the second nonvolatile memory from the second ready/busy terminal.

9. The semiconductor memory device according to claim 1, wherein the enable signal is a read enable signal.

10. The semiconductor memory device according to claim 1, wherein the enable signal is a write enable signal.

* * * * *